(12) United States Patent
Babokhov et al.

(10) Patent No.: US 11,966,681 B2
(45) Date of Patent: Apr. 23, 2024

(54) TOPOLOGY-DRIVEN STRUCTURED TRUNK ROUTING

(71) Applicant: Intel Corporation, Santa Clara, CA (US)

(72) Inventors: Sergei Babokhov, Acton, MA (US); Charles Magnuson, Sutton, MA (US)

(73) Assignee: Intel Corporation, Santa Clara, CA (US)

( * ) Notice: Subject to any disclaimer, the term of this patent is extended or adjusted under 35 U.S.C. 154(b) by 677 days.

(21) Appl. No.: 17/002,611

(22) Filed: Aug. 25, 2020

(65) Prior Publication Data

US 2022/0067267 A1    Mar. 3, 2022

(51) Int. Cl.
| | |
|---|---|
| *G06F 30/3953* | (2020.01) |
| *G06F 16/23* | (2019.01) |
| *G06F 30/31* | (2020.01) |
| *G06F 30/327* | (2020.01) |
| *G06F 30/3947* | (2020.01) |

(52) U.S. Cl.
CPC ...... *G06F 30/3953* (2020.01); *G06F 16/2379* (2019.01); *G06F 30/31* (2020.01); *G06F 30/327* (2020.01); *G06F 30/3947* (2020.01)

(58) Field of Classification Search
CPC .. G06F 30/3953; G06F 30/31; G06F 30/3947; G06F 30/327; G06F 30/3306; G06F 16/2379
USPC ............................ 716/130, 104, 122; 703/14
See application file for complete search history.

(56) References Cited

U.S. PATENT DOCUMENTS

| | | | | |
|---|---|---|---|---|
| 5,949,692 | A  * | 9/1999 | Beausang | G01R 31/31704 716/136 |
| 7,853,912 | B2 * | 12/2010 | Binder | G06F 30/3312 716/113 |
| 11,113,294 | B1 * | 9/2021 | Bourbie | G06F 16/24568 |
| 11,644,955 | B1 * | 5/2023 | Singamneni | G06F 16/248 707/722 |
| 2018/0004885 | A1 * | 1/2018 | Affeldt | G06F 30/394 |
| 2021/0073343 | A1 * | 3/2021 | Musante | G06F 30/327 |
| 2021/0192115 | A1 * | 6/2021 | Babokhov | G06F 30/394 |

* cited by examiner

*Primary Examiner* — Phallaka Kik
(74) *Attorney, Agent, or Firm* — Schwabe, Williamson & Wyatt, P.C.

(57) ABSTRACT

The computer executable instructions include a command that accepts multiple user input through various command options. The command encapsulates and implements multiple original software algorithms that convert trunking design intent, expressed via the command options, into trunks on multiple layers of a process technology node. Once executed, the command generates shapes of trunks of specified topology on specified layers. The command includes a set of options to generate a simple or complex trunking topology. The command accepts topology, set of zones, nets and many other options that the user provides to the command to yield trunks of a desired topology. The topology description is relative; thus, it can easily adjust as design changes. The command together with its options represents trunk creation intent.

23 Claims, 36 Drawing Sheets

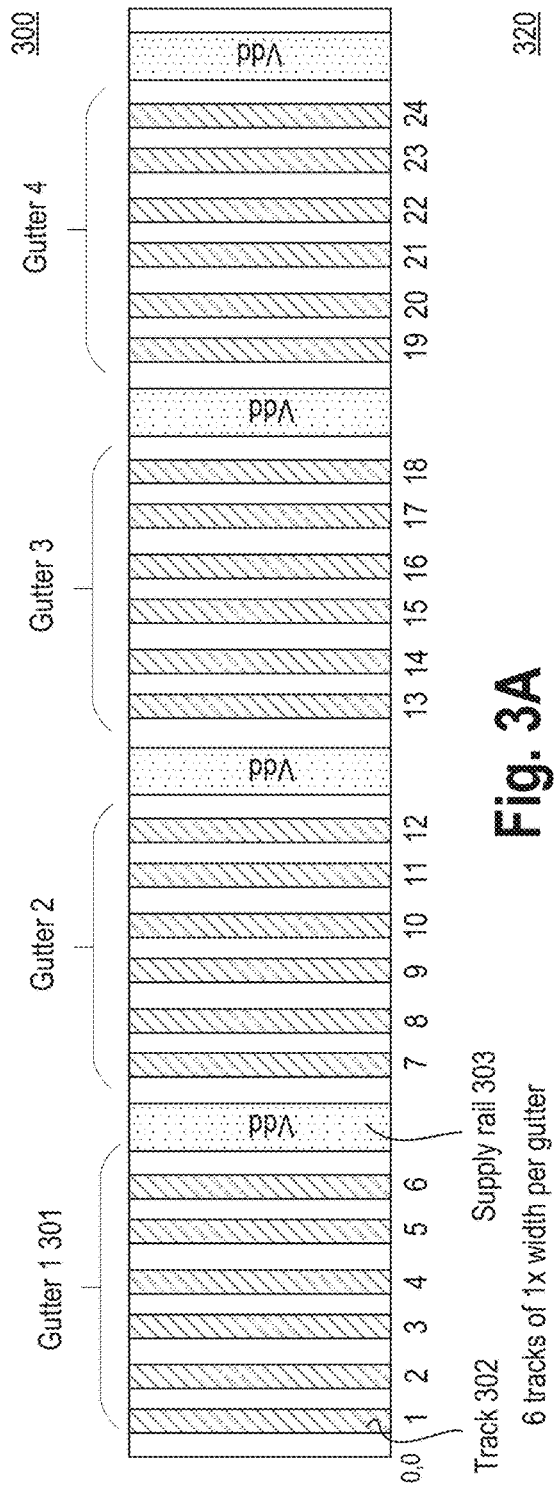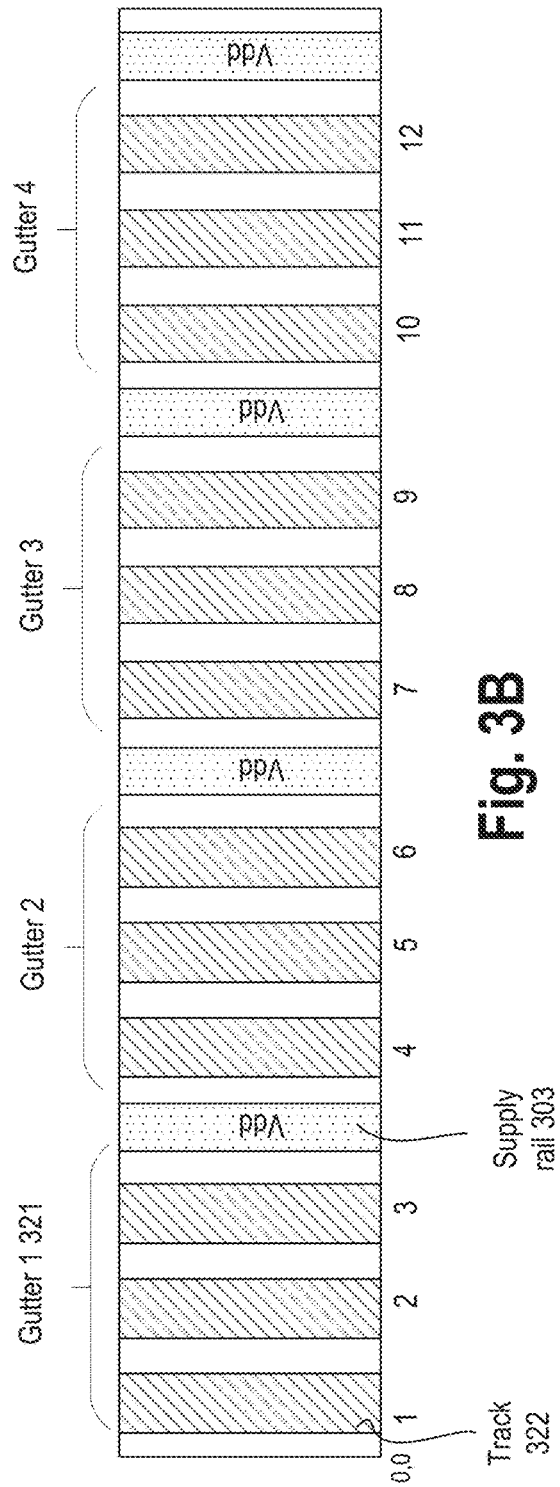

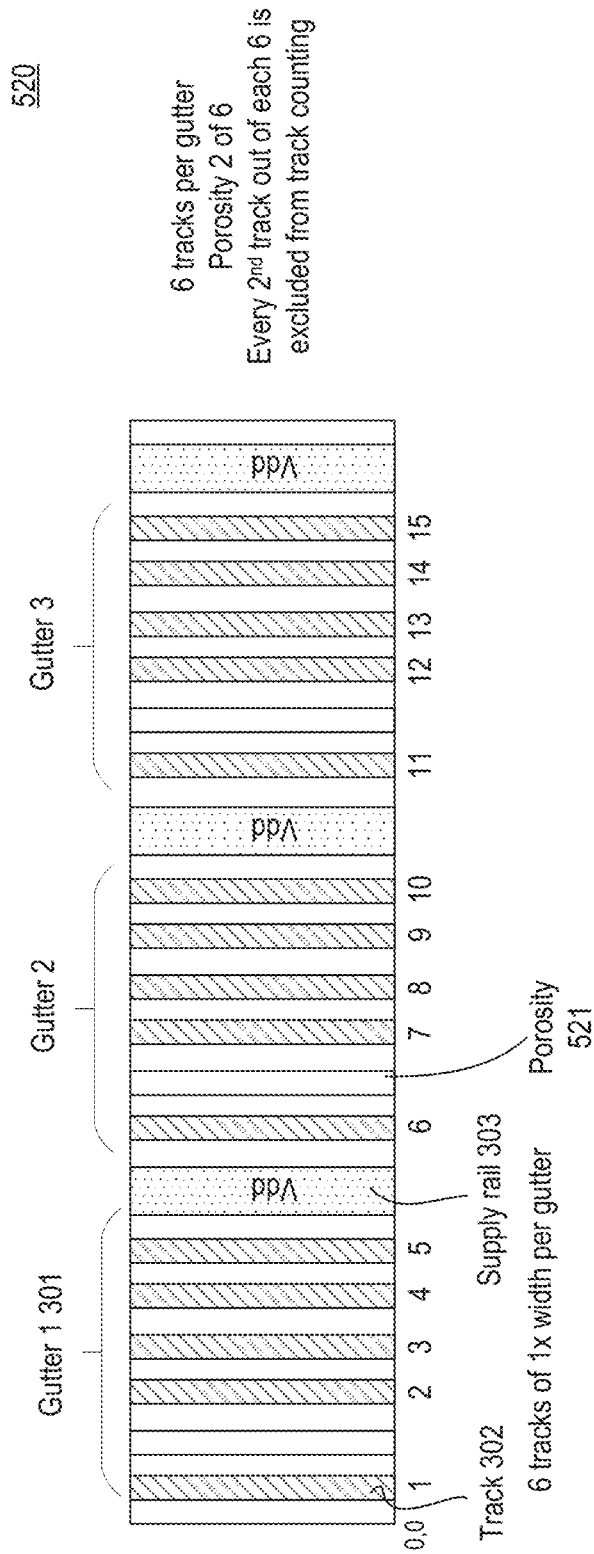

TOPOLOGY-DRIVEN STRUCTURED TRUNK ROUTING

BACKGROUND

High speed and analog/mix signal design often require custom routing topologies to ensure Power, Performance, and Area (PPA) targets as well as time to market goals are met. Aggressive scaling, complex Design rule Checking (DRC) rules and metal sharing scenarios have increased the complexity. Existing solutions are unable to achieve design efficiencies needed. Significant flow innovations are needed to enable rapid prototyping and what-if analysis with changing floorplans, re-usability and scalability throughout the entire design cycle.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIGS. 3A-B illustrate two sets of topologies having two gutters with different track plans, in accordance with some embodiments.

FIGS. 5A-C illustrate various track porosities, in accordance with some embodiments.

DETAILED DESCRIPTION

Figure 1:
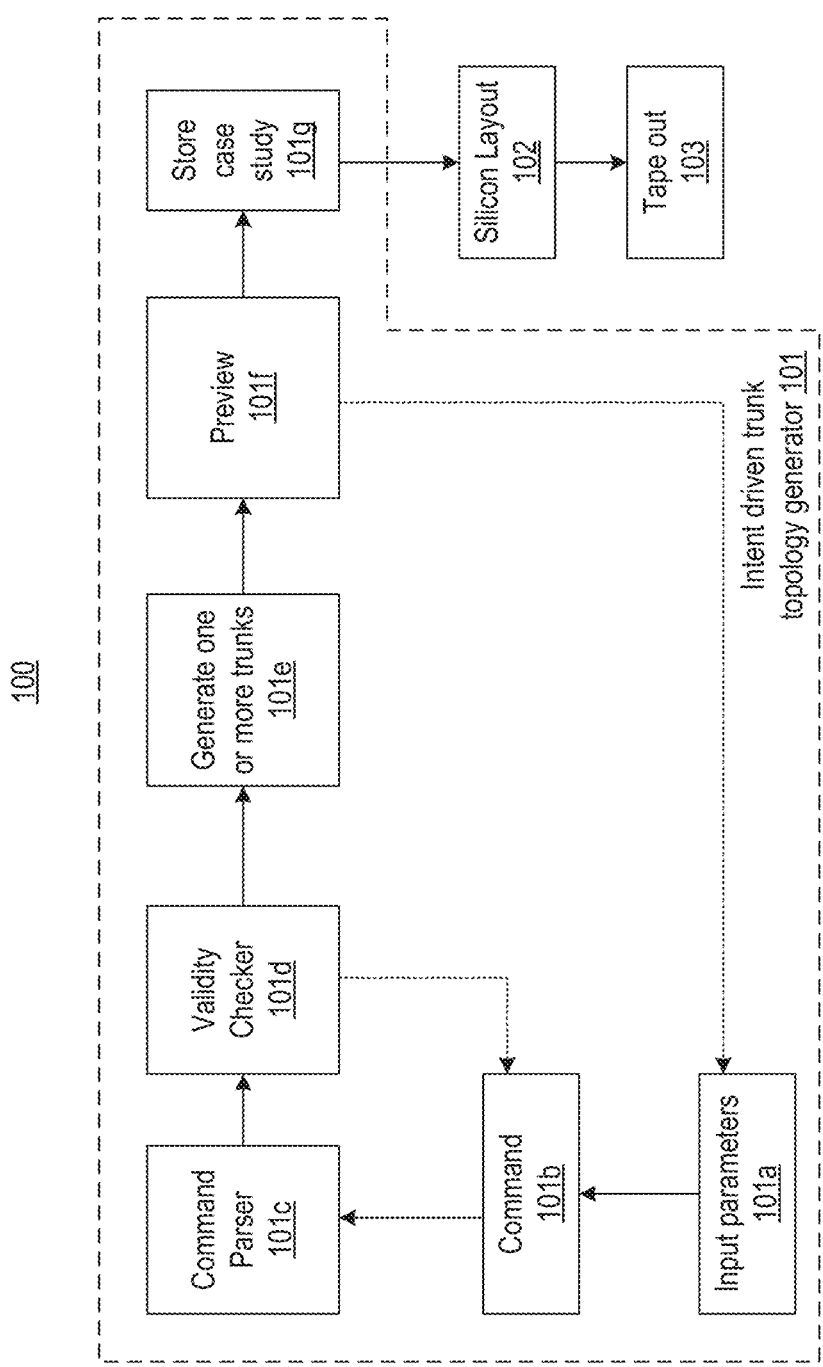
FIG. 1 illustrates a flowchart of a method for generating intent driven trunk topology, in accordance with some embodiments.

Today's custom routing solutions, such as Custom Galaxy Router, Create Route Tool as well as Unified Topology Constraint Tool in ICC2™ by Synopsys® do not meet the needs of an intent driven, command based, reproducible approach that enables what-if scenarios to analyze early floorplan feasibility to achieve quick design convergence.

Some embodiments provide a scheme of trunk creation that utilizes a unique topology model that is comprised of a start point, end point and any number of optional intermediate jog points connected by segments of multiple layers and widths. Point coordinates are not specified directly in terms of micron values, rather multiple reference objects are used to derive coordinates from. In some embodiments, a topology point coordinate is calculated relative to a reference geometry, referred to as a zone. A zones geometry can be rectangular or rectilinear. One or multiple zones can be used to calculate a topology point. Zone coordinates can be either defined in terms of micron values or derived from multiple reference objects. The resulting trunks created from a topology and zone description do not have to belong to any of the reference zone, they are getting generated in coordinate system of the current block.

The scheme of some embodiments is developed using computer executable instructions (e.g., an encoded a TCL language). The computer executable instructions include a command that accepts multiple user input through various command options. The command encapsulates and implements multiple original software algorithms that convert trunking design intent, expressed via the command options, into trunks on multiple layers of a process technology node. Once executed, the command generates shapes of trunks of specified topology on specified layers for specified nets.

There are many technical effects of the various embodiments. For example, by invoking a command (e.g., a single command) with a set of options, a simple or complex trunking topology can be generated. The command accepts topology, set of zones, nets and many other options that the user provides to the command to yield trunks of a desired topology. The topology description is relative; thus, it can easily adjust as design changes. The command together with its options represents trunk creation intent. A sequence of commands can be saved in a trunk recipe file that can be used later to create or re-create trunks in a changed design context at any point. Trunking results are deterministic since the command is self-contained and does not depend on any execution state. The scheme of various embodiments not only simplifies the management of intent for trunk creation, but also enables quick what-if scenarios just by modifying input options to the command to analyze floorplan feasibilities thus making silicon design convergence much faster. The command is also process independent enabling easy design migration and reuse for through leveraging design intent for the derivatives. Other technical effects will be evident from the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e g, immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and may be subsequently being reduced in layout area. In some cases, scaling also refers to upsizing a design from one process technology to another process technology and may be subsequently increasing layout area. The term "scaling" generally also refers to downsizing or upsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right." "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFBT device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

FIG. 1 illustrates flowchart 100 of a method for generating intent driven trunk topology, in accordance with some embodiments. While various blocks are illustrated in a particular order, the order can be modified. For example, some block may be performed before others while some blocks can be performed in parallel. Flowchart 100 illustrates block 101 for intent driven trunk topology generation, and post topology generation activities including silicon layout 102 of the trunks and tape out 103 of an integrated circuit (IC) having the intent driven trunks.

The scheme of trunk creation utilizes a unique topology model that is comprised of a start point, end point and any number of optional intermediate points connected by segments of multiple layers and widths. Point coordinates are not specified directly in terms of micron values, rather we use multiple reference objects to derive coordinates from.

A topology point coordinate is calculated relative to a reference geometry, referred to as a zone. A zones geometry can be rectangular or rectilinear. One or multiple zones can be used to calculate a topology point. Zone coordinates can be either defined in terms of micron values or derived from multiple reference objects. Resulting trunks created from a topology and zone description do not have to belong to any of the reference zone, they are getting generated in coordinate system of the current block.

To implement our method, some embodiments use an encoded a TCL (tool command language) command that accepts multiple user input through various command options. The command encapsulates and implements multiple original software algorithms developed to convert trunking design intent, expressed via command options, into trunks on multiple layers. Once executed, the command generates shapes of trunks of specified topology on specified layers for specified nets.

Here, the term "trunk" generally refers to "pre-routed wires" (the term "wire" refers to an electrical connection that has a specific physical path in the IC layout) that are created by a user "by hand," i.e., without using the routing engine to determine the routes. Typically, the pin locations for a set of nets are determined during placement, and then the routing engine creates routes for electrically connecting the pins. However, the user can specify certain routes or portions of routes upfront. Such routes or portions of routes are referred to as "trunks." The term "trunk routing" refers to a process for routing trunks.

The term "net" in described in context of a netlist which is a list (or collection) of "nets." Each "net" refers to a set of gates (or cells) whose inputs/outputs are electrically connected. For example, suppose a driver cell drives the inputs of a set of driven cells. In this example, the term "net" can refer to the portion of the netlist that includes the driver cell, the set of driven cells, and the electrical connections (e.g., the network of metal wires) that connect the output of the driver cell and the inputs of the set of driven cells.

To meet the requirements of high speed and mixed signal interconnect, routing is structured and pre-planned. Trunking is an optimal way to ensure that the stringent requirements for the critical nets are met. To guarantee repeatability, re-spinnability, and fast design convergence, user intent-driven approach to trunk routing of various embodiments is adapted.

Here, routing intent is different from routing constraints. Routing intent is a high-level description of what should be done with the routing. One example of a routing intent can be described as following: "I would like these net busses to be routed in a "Z"-shape topology connecting these two macros in these two layers." In contrast, routing constraints are a set of configuration parameters that correspond to options of a routing engine and control the behavior of the routing engine at the lowest level granularity of the routing process. Examples of routing constraints include: defining a region to be a routing corridor, setting min and max routing layers, setting various costs per layer, creating a non-default routing rule, and many more other routing options to specify where the routing engine can place shapes and where it cannot. The set of constraints represents a routing engine state and special care needs to be taken to save previous values and roll back. However, routing constraints cannot be used to capture a high-level intent that a user has for routing the trunk.

A user specifies routing intent by using input parameters 101a and a set of commands 101b. The set of commands can be provided in a file, or they can be generated based on a user interacting with a tool. For example, the set of commands 101b can be entered in a file and the file then read, parsed and executed by a program. In another example, command 101b and its input parameters are entered via graphical user interface (GUI). The GUI is opened and used to launch and/or execute the intent driven topology generator.

Regardless of how the user's trunk routing intent is encoded and provided to the IC design tool, the command name and the combination of its options convey the routing intent and hides the implementation details from the user. The commands 101b may not use actual/hard coded coordinate values, thereby ensuring that routing can be reproduced with an electrical design change order or in a new process.

The commands 101b of various embodiments reference existing objects, e.g., pins/ports, cells, and shapes. By up-leveling the commands 101b to use objects instead of coordinates, it makes the routing result adjustable to the current layout, i.e., it makes the intent "relative" to the objects in the layout, which also makes the trunk routing intent specification ECO friendly.

The command 101b is packed with functionality to ensure all possible trunking tasks, including but not limited to; Shielding (full, half, cap_shield), interleave, swizzle, generation of pins, user shape and blockages. Some embodiments support partial trunk creation by excluding certain trunk segments and custom pullbacks from edge. The command not only can be used to generate trunks for signal nets, it can also we used to generate power grids due to flexible nature including "trim_area" (all trunks OUTSIDE area are trimmed to the area, "everything outside removed") and "cutout_area (all trunks INSIDE are removed to the area, "everything inside removed").

Options for various input parameters 101a and the syntax of the structure of command 101b are described herein.

cr_create_trunk_from_here_to_there #Creates trunk(s) based on topology description

[-nets] (list of nets to create trunk(s) for)

[-ref_nets] (list of reference nets to get port/pin locations to reference track. Must be of the same length as -nets)

[-nets_order] (values 'interleave/reverse/expand,bit|etc.' interleave nets, e.g. -nets 'a[0:7] b[0:7]' will result in 'a[0] b[0] . . . [a[7] b[7]')

[-zone] (list of named trunking zones, e.g. 'ch1:my_cell_1 ch2:slice/right_cell', channel is absolute bbox (or cell_name) or net(s) bbox))

[-bloat_zone] (inflates bbox of net(s) member of the zone: 'ch,10.06,−2.6' bloats ch1 bbox 10.06 micron in X direction and −2.6 micron in Y direction)

[-topology] (topology description as a list of legs that reference trunking channels and their layers/width/track/micron/p values)

[-skip_tracks] (rule to skip tracks, e.g 'm8,9,5 m9,10,3-7-9' meaning out of each 10 tracks for m9 skip 3d, 7th and 9th)

[-avoid_area] (list cells/absolute bbox-es/relative (to cells) bboxes to avoid, 'mdf* 18694.8000:0.0000: 19595.5200:1184.8320 sprtile33,0:0:200:200 sprtile43, 0:0:200:200' any track within these bboxes will be skipped)

[-avoid_layers] (list of,-separated layers per each element of -avoid_area list. Any track for these layers within -avoid_area bboxes will be skipped)

[-trim_area] (list cells/absolute bbox-es/relative (to cells) bboxes to be used to trim trunks, 'mdf* 18694.8000: 0.0000:19595.5200:1184.8320 sprtile33,0:0:200:200 sprtile43,0:0:200:200' any trunk outside this area will be trimmed with ½ DR deflate)

[-cutout_area] (list cells/absolute bbox-es/relative (to cells) bboxes to be used to cutout trunks, 'mdf* 18694.8000:0.0000:19595.5200:1184.8320 sprtile33, 0:0:200:200 sprtile43,0:0:200:200' any trunk inside this area will be cutout)

[-cutout_bloat] (bloat cutout area in DR units, + to inflate, − to deflate)

[-do_not_cutout_nets] (list of nets to be ignored while performing cutout)

[-swizzle] (Takes pairs of nets and does a one track jog/swizzle/twisted pair route, if list of nets is passed, will do every two one after another. must pass "swizzle_layer,location")

[-stepping] (list of steppings per layer/width pairs, make sure to accommodate for shielding, e.g full—3, half—2)

[-create port] (create port(s) from trunk(s))

[-create_user_shape] (create user shape(s) from trunk(s))

[-create_blockage] (create blockages(s) from trunk(s))

[-use_pin] (Use edge pin(s) for specified channels to override layer/width/location (track/micron) for edge topology definition(s))

[-num_wires] (number of trunks to create per net)

[-track_overrides_pin] (even if pin exists, use the track number passed)

[-reuse_zone_tracks] (do not fetch tracks for channel, re-use from previous call)

[-clean_zone_tracks] (remove tracks cache, all consecutive call will have to fetch tracks for channel)

[-clean_named_zone_tracks] (remove tracks cache for given zones, all consecutive call will have to fetch tracks for zone(s))

[-shield] (shield)

[-shield_name] (shield name)

[-shield_type] (type of shielding to preform)

[-edge_overhang] (overhangs an edge. used to creates pins on edges after pushing trunks down the heirarchy, can't be use with -edge_pullback and/or -edge_pullback_custom)

[-edge_pullback] (pullback from edge half DR (per layer), can't be use with -edge_pullback_custom and/or -edge_overhang)

[-edge_pullback_custom] (the list of 'startlend,layer,pullback', e.g.

'start,m10,100 end,m10,10 start,m9,80 end,m9,8'. pullback from edge as specified, can't be use with -edge_pullback and/or -edge_overhang)

[-cutout_pullback] (the list of 'startlend,layer,pullback', e.g.

'end,m10,100 start,m9,80 end,m8,-18'. pullback from cutout area as specified)

[-shield_pullback] (pullback shield trunk from edge half DR (per layer))

[-wrong_way_metal] (allow wrong way metal, value is list of layer names for which wrong direction shapes are generated)

[-snap_to_track] (if topology is specified using micron value, snap coord to track for given layer/width)

[-do_not_check_shorts] (do not check if track has obstructions)

[-find_free_tracks] (finds free (un-obstructed) tracks to trunk on)

[-include_power_for_free_tracks] (when finding free tracks, you can include power straps, by default they are ignored to speed up processing)

[-v_track_freedom] (expands the X-direction search distance outside net bbox in microns to find free tracks)

[-h_track_freedom] (expands the Y-direction search distance outside net bbox in microns to find free tracks)

[-ignore_boundary_guides] (when finding free tracks, you can ignore the boundary guides used for ½ dr spacing)

[-just_clear_zone] (remove all zone annotations)

[-custom_attr] (list of shape attributes 'attr_name attr_val'| 'attr_name' assumed bool==1, that will be added to shapes of trunks)

[-custom_callback] (a procedure that will be called with created objects passed as an argument)

[-display_zone] (will annotate channels/edges and track capacity based on list of layer/width comma separated)

[-just_clear_zone] (remove all zone annotations)

[-custom_attr] (list of shape attributes 'attr_name attr_val'|'attr_name' assumed bool==1, that will be added to shapes of trunks)

[-custom_callback] (a procedure that will be called with created objects passed as an argument)

[-custom_tag] (an internal tag that will be added to a trunk, DO NOT use it in user scripts)

[-log_track_number] (reports track number that net was created on)

[-verbose] (turn on printing of display_channel capacities)

[-preview] (do not create shapes, just draw annotations of shapes)

Command 101b is executed to generate the one or more trunks and what-if scenarios. The command 101b in its simplest form specifies nets, one or more zones, and topology description that expresses a trunking design intent. In various embodiments, the command is process technology node independent. For example, the command used in a 10 nm process technology node can be used with the same options and parameters in a 7 nm process technology node. In some embodiments, command 101b comprises a starting point and an ending point, wherein the starting point includes fields separated by a separator. In some embodiments, the separator comprises a comma. In some embodiments, the fields include: zone, layer, width of a track on the layer, and coordinate reference. Coordinate reference is used to calculate a micron value of the coordinate based on a current design state and is performed at the runtime of command 101b. In some embodiments, the end point comprises one or more fields.

The process of execution comprises parsing the command, validating the command options and parameters, etc. In some embodiments, a command parser 101c parses the various options and input parameters from command 101b and/or a set of commands 101b. Command parser 101c may separate out the input parameters associated with various options so validity checker 101d can check whether the input command is valid. In some embodiments, validity checker 101d comprises logic to process zone definition and to make sure zones exist and geometry is valid. In some embodiments, validity checker 101d comprises process topology definition checker logic that ensures syntax is correct, and gets tracks in terms of layer and/or width and makes sure that the tracks exist for laying out the trunks. In some embodiments, validity checker 101d comprises logic to process stepping definition to make sure stepping maps to topology legs. In some embodiments, a user is notified of any error in the received command. In one such example, the software program prompts the user to reenter the command as indicated by the dotted line between block 101f and 101b.

The process then moves the generating one or more trunks (block 101e) in one of more zones over the parsed and validated tracks. The one or more trunks are generated according to the topology description in response to executing the command In some embodiments, generating one or more trunks (block 101e) comprises fetching tracks from the current design; and numbering the tracks relative to an edge of the one or more zones in view of obstructions, porosity, and/or avoid areas in the one or more zones, wherein the one or more zones comprises a plurality of edges, and wherein the edges are numbered clockwise from an orientation of the zone.

In some embodiments, the one or more zones zone is one or more of: a current block, wherein the geometry of the current block defines the zone; a bounding box described by coordinates relative to the current block, wherein the bounding box defines the zone; a cell at any design hierarchy wherein the geometry of the cell defines a boundary of the zone; net or bus at any level of hierarchy, wherein a bounding box of the net defines the zone; blockage, placement or routing, wherein a geometry of the blockage, placement or routing defines the zone; and/or gutter or a range of gutters, wherein a bounding box of gutters from a start gutter to an end gutter defines the zone. In some embodiments, the zone is a system of coordinates of a virtual object to calculate a topology point coordinate.

In some embodiments, the one or more trunks do not belong to any zones. Zones are virtual and temporary geometry entities (e.g., not real objects defined in the database). In some embodiments, zones are used to reference, measure or define coordinates of the trunks in the topology. In some embodiments, zones geometries are calculated at runtime of the command (e.g., zones are not persistent). These temporary geometry objects can be derived from real objects in the database like cells, nets, etc. as well as from virtual objects, like bbox definitions, gutters. Gutters as described herein are not real database objects, but are used to organize and manipulate tracks in structured way.

Topology coordinates are defined using a zone and a coordinate of a point measured relative to the zone. One might use multiple zones in the same topology definition. Which zone to use depends on how the user defines the trunking intent. Same geometry of trunk topology can be created using different zone as coordinate reference; the resulting coordinates are in the coordinate system of a current block. The command knows the zone geometry in the coordinate system of the current block and performs all re-calculations from zone(s) coordinate system to the current block.

In some embodiments, generating the one or more trunks (block 101e) comprises applying a topology model including a start point, and end point, and any number of intermediate jog points connected by segments of one or more layers and widths, wherein the one or more layers correspond to one or more layers of a process technology node.

In some embodiments, the command implementation provides a preview mode 101f when the command does not create real layout objects in the database but rather creates annotations (cartoon drawings) displayed on the canvas. The previews (annotations) are virtual layout objects, not persistent, and exist only during the interactive session. Once the session ends, the previews are destroyed. The previews give users the exact depiction of how the layout will be produced without the need of modifying the database. If command 101b includes the preview mode, the one or more trunks are not saved in a database, in accordance with some embodiments. In some embodiments, if command 101b does not include a preview mode, the one or more trunks are saved in the database.

With the preview approach, the user is free to try multiple attempts without spending the time and effort rolling back to the original state, as indicated by the dotted line between blocks 101f and 101a. This mode is extremely fast giving the user the ability to perform multiple what-if analysis thus enabling efficient iterations to get to a result quicker. Once a user achieves the desired result, the trunks and their coordinates are saved in the database as indicated by block 101g. The desired result can be committed to layout 102 by running same command without the preview mode. Additionally, the user can save the command with values of options in a file (e.g., as indicated by block 101g) such that layout can be reproduced anytime later by issuing the command.

Figure 2:
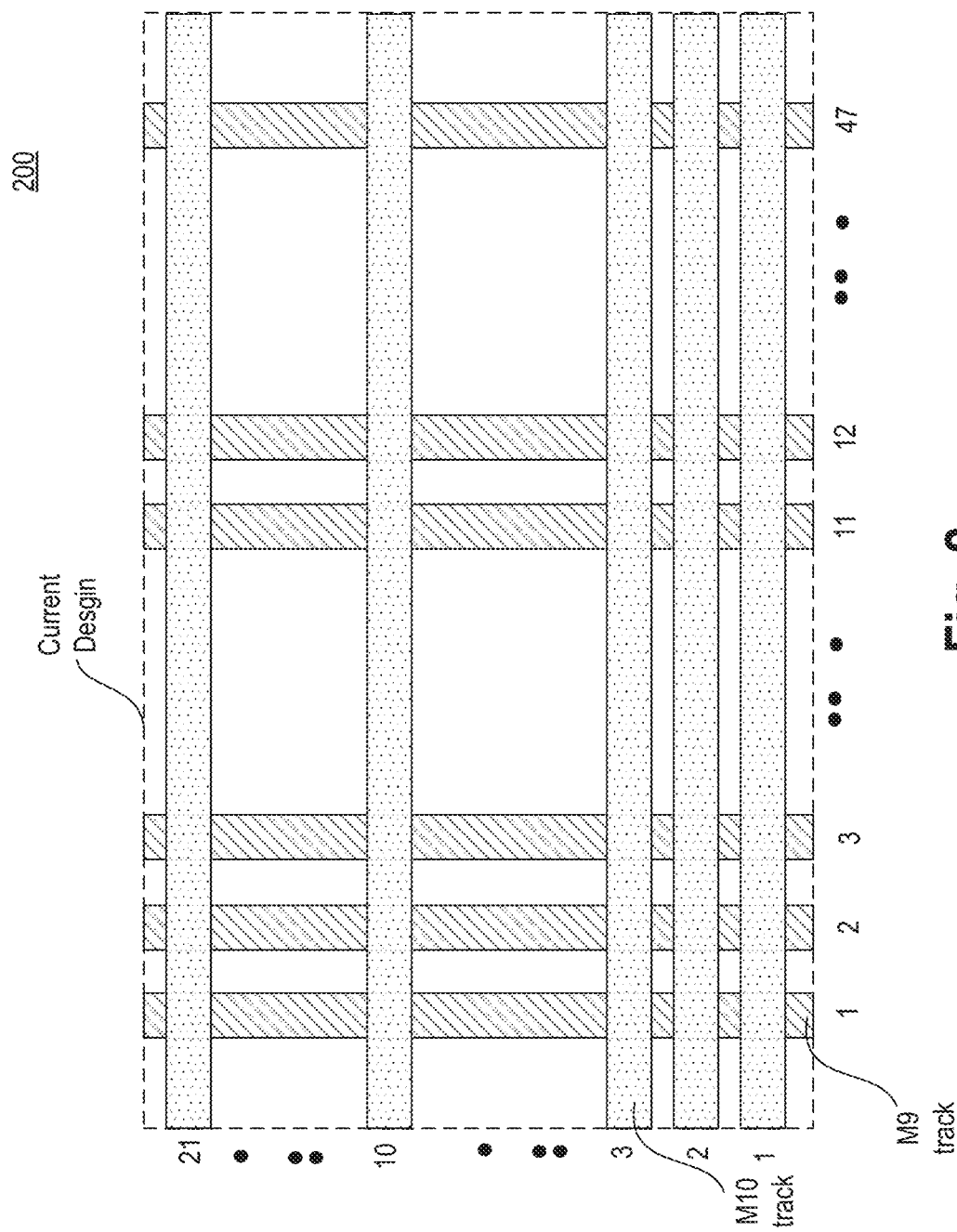
FIG. 2 illustrates a topology of vertical and horizontal tracks displayed relative to a current design, in accordance with some embodiments.

FIG. 2 illustrates topology 200 of vertical and horizontal tracks displayed relative to a current design, in accordance with some embodiments. Trunks and other routing shapes are created centered on pre-defined route tracks. Route tracks, which will be referred to as simply tracks, are objects in the design that are described by a center point coordinate and a layer with width; tracks span the entire width and height of the design. Tracks are counted starting from left to right for vertical layers and bottom to top for horizontal. In this example, the current design includes 47 M9 tracks and 21 M10 tracks orthogonal to the M9 tracks.

FIGS. 3A-B illustrate two sets of topologies 300 and 320, respectively, having two gutters with different track plans, in accordance with some embodiments. Tracks are repetitive in nature. The stepping of the repetition is defined by the distance between the power and ground rails. The set of signal tracks between the power and ground rails is referred to as a gutter.

There can be multiple track plans per gutter. For example, a track plan 300 for metal m10 gutter 301 has 6 signal tracks 302 of width 1× in between power rails 303 and another track plan 320 for metal m10 gutter 321 has 3 signal tracks 322 of width 2× in between power rails. Gutters of different track plans can abut one another and even overlap. One might consider gutters as way to organize, manipulate and utilize tracks in a structured manner.

Gutters design is done per metal layer at very early design stages for a given process technology to ensure power delivery and reliability requirements are met. Meticulous gutter design is especially used for high speed and analog mix signal designs with multiple power domains.

Gutters represent a useful means for early design (especially design floorplan) feasibility driving critical design decisions to ensure convergence to the Power, Performance, and Area (PPA) requirements. Trunking is predominately done for timing critical and analog nets in gutters of different track plans for critical partitions throughout a design. Following are a few examples of critical partitions with trunks on multiple gutters: clock-mesh partition, double data rate (DDR) to memory controller (MC) routing partition, structured data-paths style blocks, like low-level cache (LLC) and others.

Figure 4:
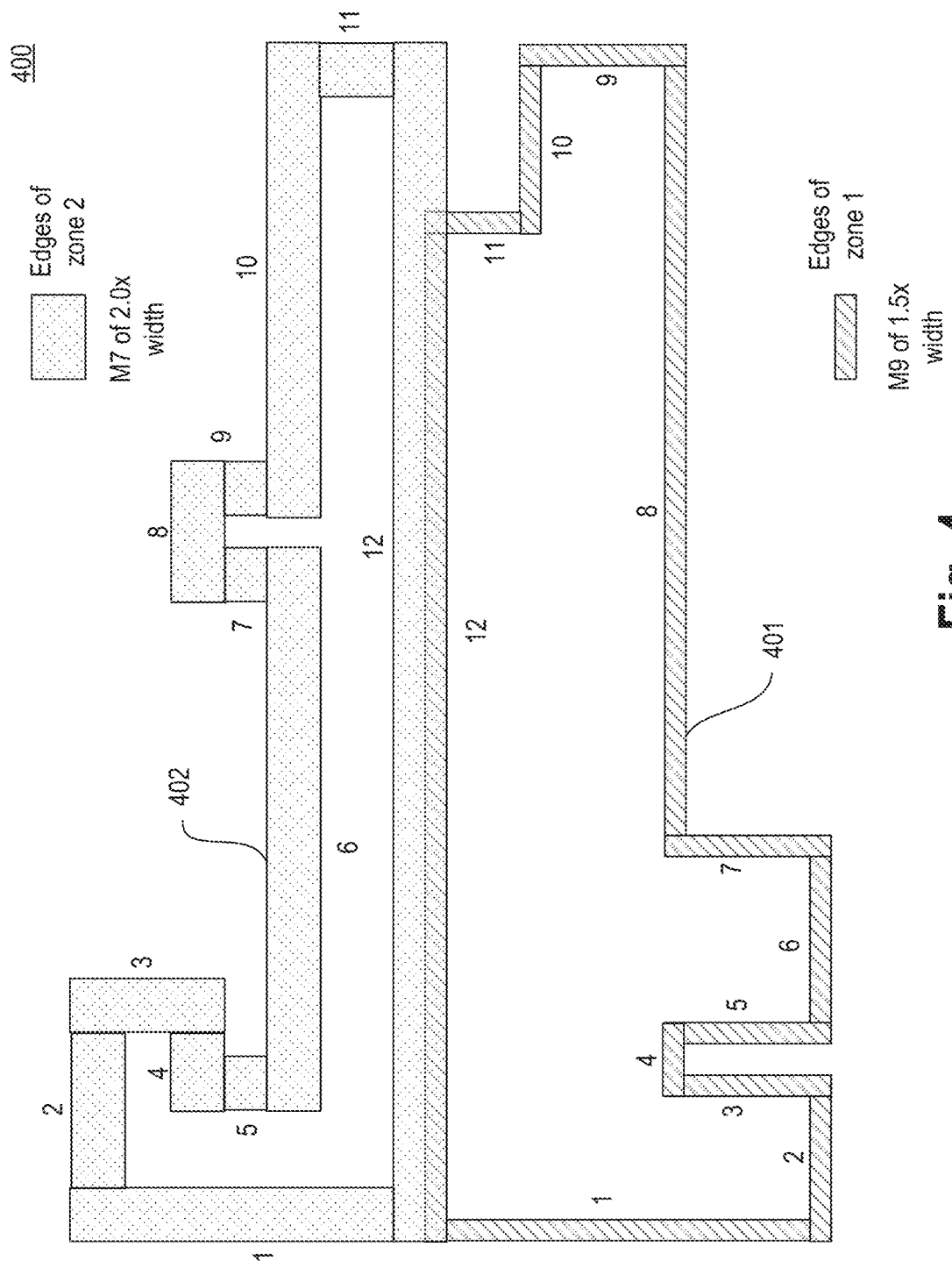
FIG. 4 illustrates an example of two zones with rectilinear boundaries, in accordance with some embodiments.

FIG. 4 illustrates example 400 of two zones with rectilinear boundaries, in accordance with some embodiments. The first zone comprises edges 401 while the second zone comprises edges 402. The edges are enumerated clockwise from an orientation of the zone. Track capacities are reported using a special option to the command A zone is defined by a name, layer, width of the layer, and number of tracks in that zone.

Figure 5A:
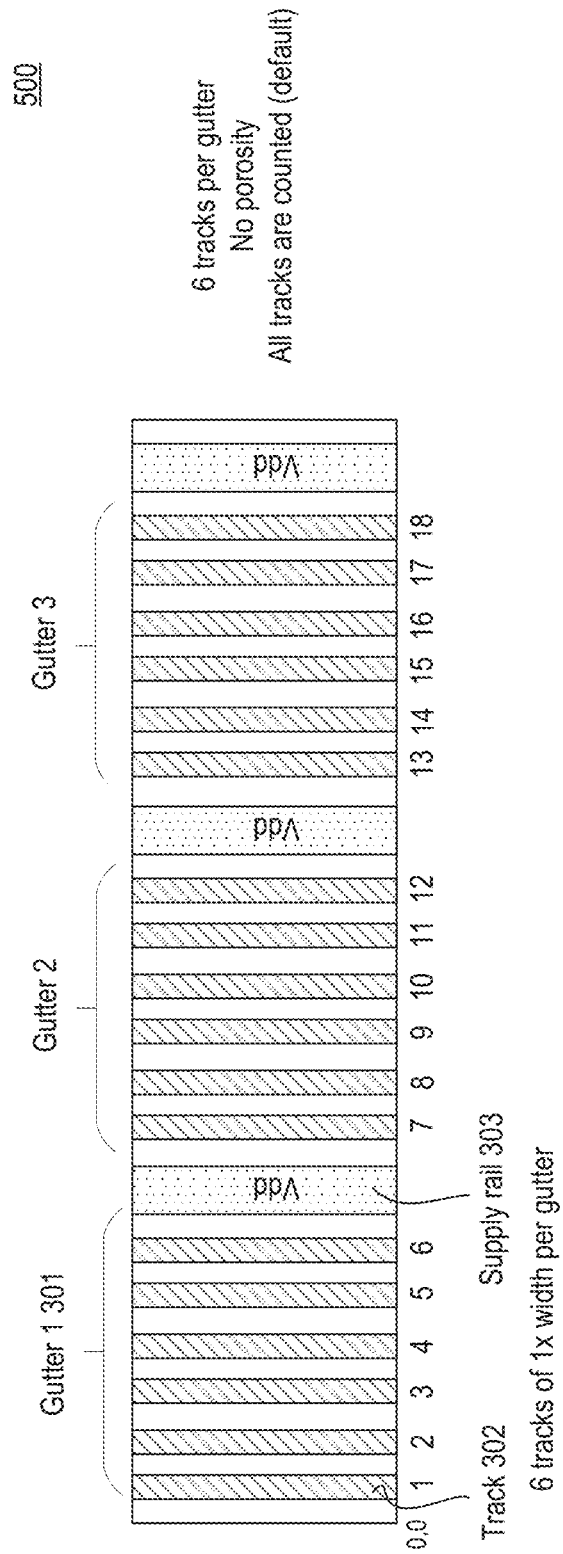
Figure 5C:
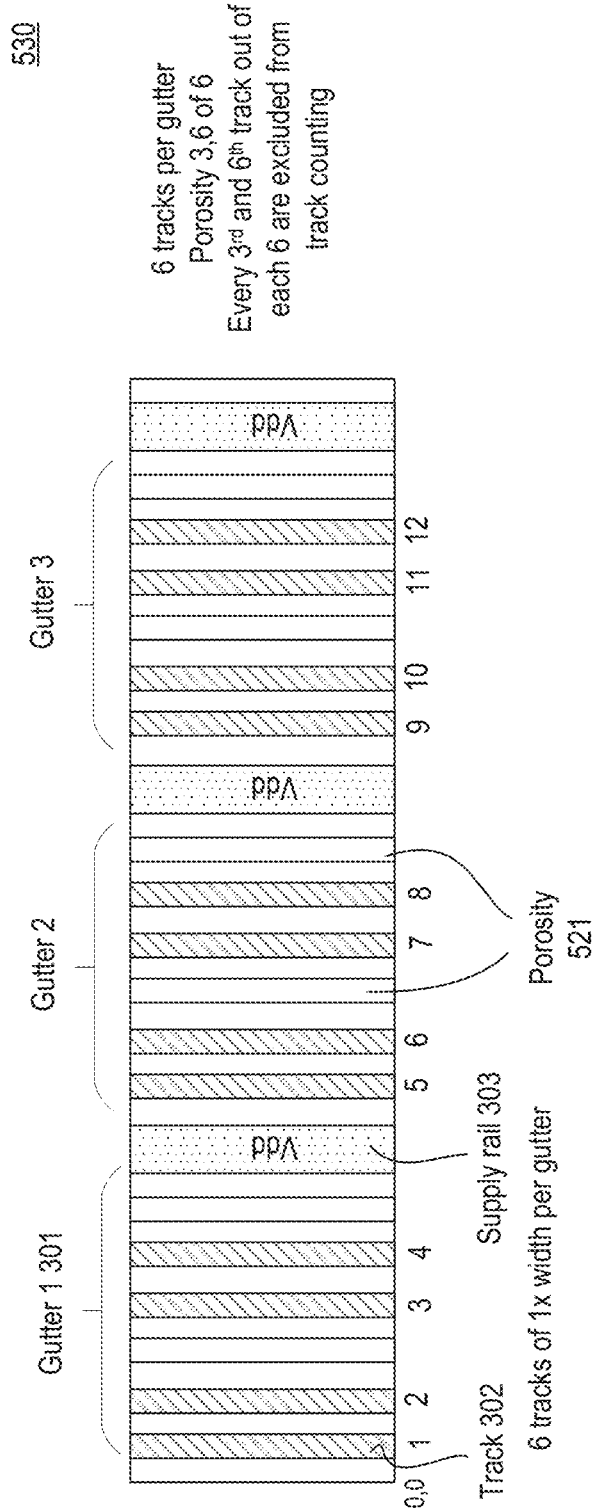

FIGS. 5A-C illustrate various topologies 500, 520, and 520, respectively of track porosities, in accordance with some embodiments. Certain tracks can be reserved for future use by excluding them from the routing resources. Usually tracks are reserved or excluded on a per gutter basis. The reservation of tracks for future use is described using the concept of "porosity". Porosity is described as track numbers excluded from a gutter. Porosity is exclusion of certain tracks from the gutter. There is another method to exclude tracks when an entire region or set of regions are defined to exclude tracks crossing those regions. These regions are collectively referred to as an "avoid area". To provide a finer control, only tracks of certain layers can be excluded from the regions defined by avoid area.

Topology 500 shows the case of 6 tracks per gutter and no porosity. Here all tracks are counted (which is the default method of counting). Topology 520 shows the case where the porosity is 2 of 6 as indicated by reference sign 521. In this case, every second track out of each of the six signal tracks is excluded from track counting. Topology 530 shows the case where the porosity for tracks 3 and 6 in the group of 6 tracks per gutter. In this case, tracks numbers 3 and 6 of each gutter are reserved for future use and thus excluded from counting. Here, the porosity is 3,6 of 6, means that out of every 6 tracks, each $3^{rd}$ and 6th are unavailable for track routing for intent driven trunk generation.

Figure 6:
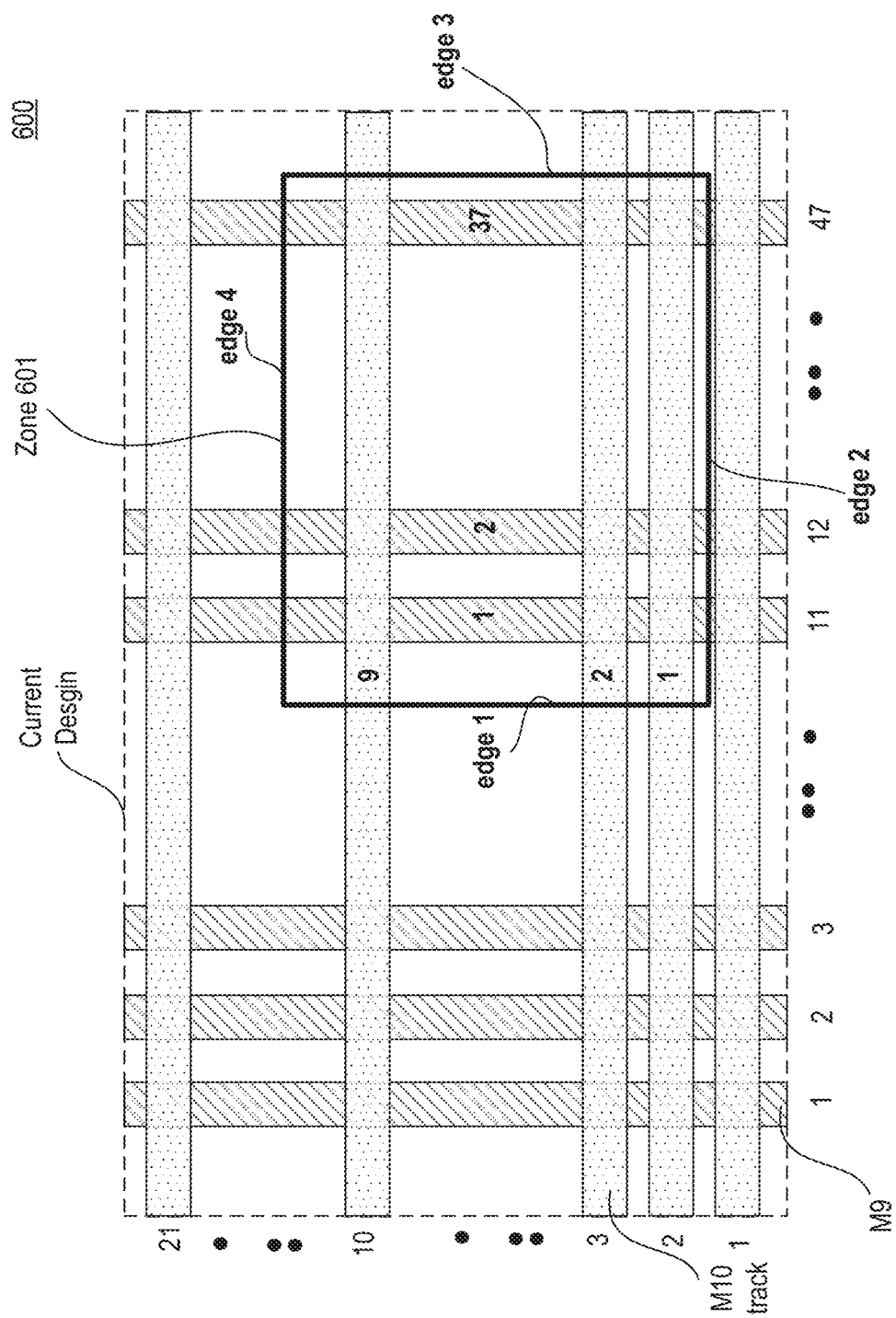
FIG. 6 illustrates a zone with vertical and horizontal tracks numbered relative to the zone, in accordance with some embodiments.

FIG. 6 illustrates a topology zone 600 with vertical and horizontal tracks numbered relative to zone 601, in accordance with some embodiments. The geometry of zone 601 is described by its x,y values of its boundary vertices. In some embodiments, the coordinates of the vertices can be derived from a zone of a certain type. Zones can be one or a list of Types shown in Table 1.

TABLE 1

| Zone | Description |
|---|---|
| Current block Bounding box | Geometry of the current block defines the zone Described by coordinates relative to the current block, wherein the bounding box defines the zone |
| Cell at any level of the design hierarchy | The geometry of the cells boundary. For a zone of type cell, the orientation of the cell matters as it changes the direction of the tracks enumeration (e.g., FIG. 6) |
| Net/Bus at any level of the hierarchy | The geometry is the bounding box of the net. |
| Blockage, placement or routing | A geometry of the blockage, placement or routing defines the zone; |
| Gutter or range of gutters | The bounding box of gutters from a start gutter to an end gutter defines the zone. |

The tracks are counted or numbered from 1 or a reference number edge 1 of the zone. In this example, M10 tracks are counted from 1 to 9 in zone 601, where track 1 of zone 601 is same as track 2 of current design. The same is true for M9 tracks where track 1 of zone 601 is the same as track 11 of M9 track in current design. When zone my_zone is referenced in a topology description, the enumeration of tracks starts from origin of the zone, in accordance with various embodiments.

In some embodiments, for ease of reference, zones can be aliased by using ':' in a topology definition. Some examples are illustrated in Table 2.

TABLE 2

| Topology definition | Description |
|---|---|
| t :_ top_ | 't' is random alias used in topological definition<br>"_top_" is reserved name used for zone representing boundary of current cell |
| h:hch3n | 'h' is random alias to be used in topological definition<br>"0:0:100:100" is user supplied boundary to be used as zone reference |
| s:sprtile31/cfs | 's' is a random alias to be used in topological definition<br>"sprtile31/cfs" is hierarchical cell's boundary used as zone boundary |
| ch:0:0:100:100 | "ch" is random alias to be used in topological definition<br>"0:0:100:100" is user supplied boundary to be used as zone reference |
| mc:core_pip_i/cab_eci_ic3_x_data_d2_0 | "nc" is a random aslias<br>"core_pip_i/cab_eci_ic3_x_data_d2_0" is a hierarchical net name where bounding box (bbox) is derived and used as zone boundary |
| nb:fivrhip_sfr_c0_r0_fglobal_visa_startid[0:8] | "nb" is a random alias<br>"fivrhip_sfr_c0_r0_fglobal_visa_startid[0:8]" is a net bus that combines net bbox of all nets in a bus, where the net bus is used as boundary for zone |

Some examples of zone of type gutter are:

z:m9:5:20—gutters are counted relative to origin of the current block (_top_). The boundary is combined boundary of gutters, starting from gutter #5 to gutter #20 inclusive. For horizontal layers the boundary spans the whole width of the current block, for vertical—the whole height.

z:m9:1:7,offset—gutters are counted relative to the origin plus offset of the current block (_top_). The boundary is combined boundary of gutters, starting from gutter #1 (from offset) to gutter #7 (from offset) inclusive. Offset value can be either a micron value or a cell, in case of a cell offset value is origin of the cell. For micron offset, the boundary spans the whole width or the height of the current block. For cell offset, the boundary spans the whole width or the height of the cell.

z:m9:my_cell,1:20—gutters are relative to the origin of a cell, my_cell. Gutters are inside of my_cell. The boundary is combined boundary of gutters, starting from gutter #1 to gutter #20 (inclusive) in a cell my_cell. Trunk counting is cell orientation dependent like a zone of type cell. The boundary spans the whole width or the height of the cell.

Figure 7:
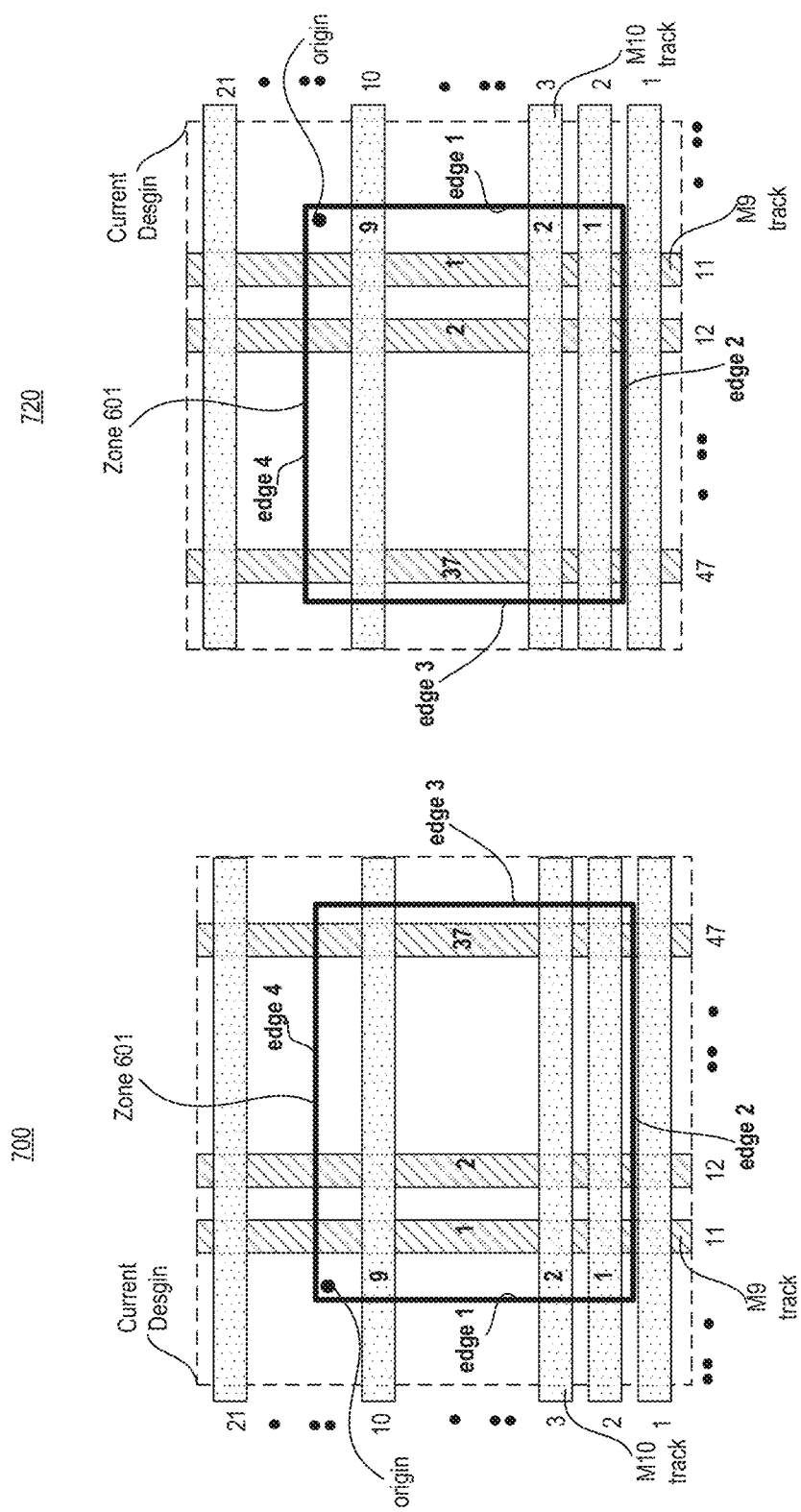
FIGS. 7A-B illustrate track enumeration when a zone is a cell and the cell is flipped across the y-axis, in accordance with some embodiments.

FIGS. 7A-B illustrate track enumeration when a zone is a cell and the cell is flipped across the y-axis, in accordance with some embodiments. Topology 700 is same as topology 600 while topology 720 is flopped across the y-axis. The numbering changes when zone 601 is a cell and the cell is flipped across the y-axis.

A topology description can use one or many different zones to reference coordinates. Resulting trunks created from a topology and zone description do not have to belong to any of the reference zones. Zones can be joined, disjoined and used as a reference to produce multiple flexible routing topologies.

Figure 8:
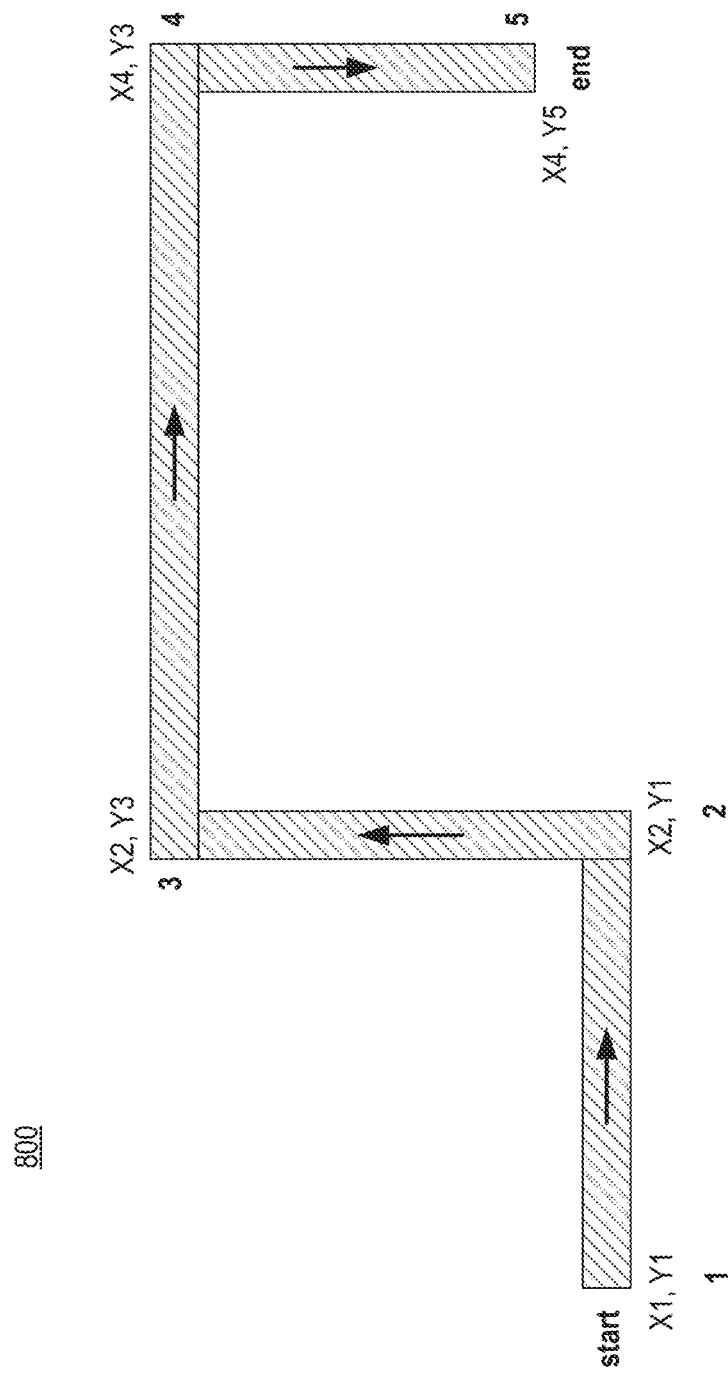
FIG. 8 illustrates a Manhattan path of five points and four segments with minimum coordinates to define the topology, in accordance with some embodiments.

FIG. 8 illustrates a Manhattan path 800 of five points and four segments with minimum coordinates to define the topology, in accordance with some embodiments. In some embodiments, topology representation is modeled after the natural way one would draw a Manhattan path on a piece of paper. For example, a first track is drawn from a starting point 1 at the bottom-left corner of the piece of paper to the next point 2 in horizontal direction from left to right, stop at point 2, a second track starts from point 2 to the next point 3 in vertical direction from bottom to top, stops at point 3, and so on until the track stops at the last point N. Each segment represents a trunk leg, each segment also carries information about a layer of the trunk leg in the topology.

In this model topology, an ordered list of points is defined by its coordinates measured relative to a supplied zone geometry and supplied layer and layer-width of a trunk segment connecting each 2 consecutive points either in horizontal or vertical directions. A topology has the start point and the end point and, optionally, any number of intermediate, jog points. Connected segments of the topology change their direction from horizontal-to-vertical or vertical-to-horizontal. Therefore, it may be enough to specify 2 coordinates, x and y, for the starting point and a single coordinate, x for vertical and y for horizontal, for all other points of the segments as they inherit the other coordinate from the end point of previous segment.

In addition to using micron values to define a coordinate, some embodiments use multiple reference objects to derive coordinates from. Objects are zone tracks, zone edges, zone track capacities, track gutters, trunk extensions as length in micron, ports, pins, trunks. Both pins and ports with multiple terminals are supported by the command. Reference objects usually are associated with layers and layer width(s) and sometimes nets. In some embodiments, the lowest level of coordinate specified is either micron values or track numbers per layer and width relative to a zone.

The following section provides an example of a syntax to specify a topology as a list of consecutive points.

In some embodiments, the topology coordinate comprises 4 comma ',' separated fields which include: zone, layer, width, and coordinate_reference. In some embodiments, the start of the topology description has the four fields specified. In some embodiments, the end of the topology comprises at least one field in the description. For example, in topology "a.1,m8,1x,20 a.3", the end point is a short-cut "a.3". By specifying zone.edge for the end point, the previous description fields for metal layer, width, and track is used to define the end coordinate.

In some embodiments, start topology on an edge of a zone specifies two coordinates in one description. For example, topology "a.1,m8,1x,20 a.3". A topology can have description comprising a start point that includes the four comma separated descriptors, and a single end topology descriptor that is a zone.something "a". For example, topology "a.1,b,b,d a.3".

In some embodiments, a topology can have a description comprising a start point that includes the four comma separated descriptors, and an end point that also includes all four comma separated descriptors but not on an edge. For example, "a.1,b,c,d a,b,c,d".

In some embodiments, the first value 'a' in the description of a topology "a,b,c,d" is the zone element name In some embodiments, the zone is defined in -zone option. In some embodiments, the zone element can be a zone itself (e.g., cell, bbox, net, top level). In some embodiments, the zone element can be a zone and edge number of the zone. In some embodiments, the zone element can be a zone and minimum (e.g., reference minimum rmin and instance minimum imin) The minimum is automatically determined by the minimum x or y edge depending on the layer in the topological description. In some embodiments, the zone can be a zone and maximum (e.g., reference maximum rmax and instance maximum imax). The maximum is automatically determined by the maximum x or y edge depending on the layer in the topological. Here, .rmin/.imin and .rmax/.imax are a subset of edge number for ease of specifying edge, when dealing with rectilinear boundaries. Simply by putting, .rmin/.imin or .rmax/.imax at end of zone, then there is no need to specify the edge number like using .edge_number. "rmin" is translated to the left/bottom most edge with respect to an original of a cell. "rmax" is translated to the right/top most edge with respect to an original of a cell. "imin" is translated to the left/bottom most edge and ignores the translation of the cell. "imax" is translated to the right/top most edge and ignores the translation of the cell.

In some embodiments, the second value 'b' in the description of a topology "a,b,c,d" is the layer name (e.g., m8 for metal layer 8). In some embodiments, the third value 'c' in the description of a topology "a,b,c,d" is the width name (e.g., 2x). By specifying values 'b' and 'c', which track to use is defined. The fourth value 'd' in the description of a topology "a,b,c,d" defines a coordinate or point. Table 3 illustrates some examples of the fourth value 'd'

TABLE 3

| Fourth value 'd' → how to get coordinate, value examples | Relative to zone element considering orientation |
| --- | --- |
| 100 | Exact track number |
| 100.00 | Micron location |
| 100.00r | Micron location snapped to closest track number to left/bottom |
| 100.00R | Micron location snapped to closest track number to right/top |
| end | Use the last track number in zone |
| end-2 | Use the $3^{rd}$ from last track in the zone |
| end-2.Or | Calculate location end-2 microns and snap to left/bottom track |
| 20% | Use track 20% of track capacity 1% is track number 1, 100% is track number end |
| P | Uppercase 'P' means reference from port |
| p | Lowercase 'p' means reference from pin |
| po | Reference pin of driver |
| pi | Reference pin of receiver |
| 13e+4 or 13e−4 | Track number associated with edge 13 + or − 4 tracks |
| 3.5g | Use the $3^{rd}$ track of gutter 5 |
| T | Finds trunk on specified layer, then finds track # of trunk |

Figure 9:
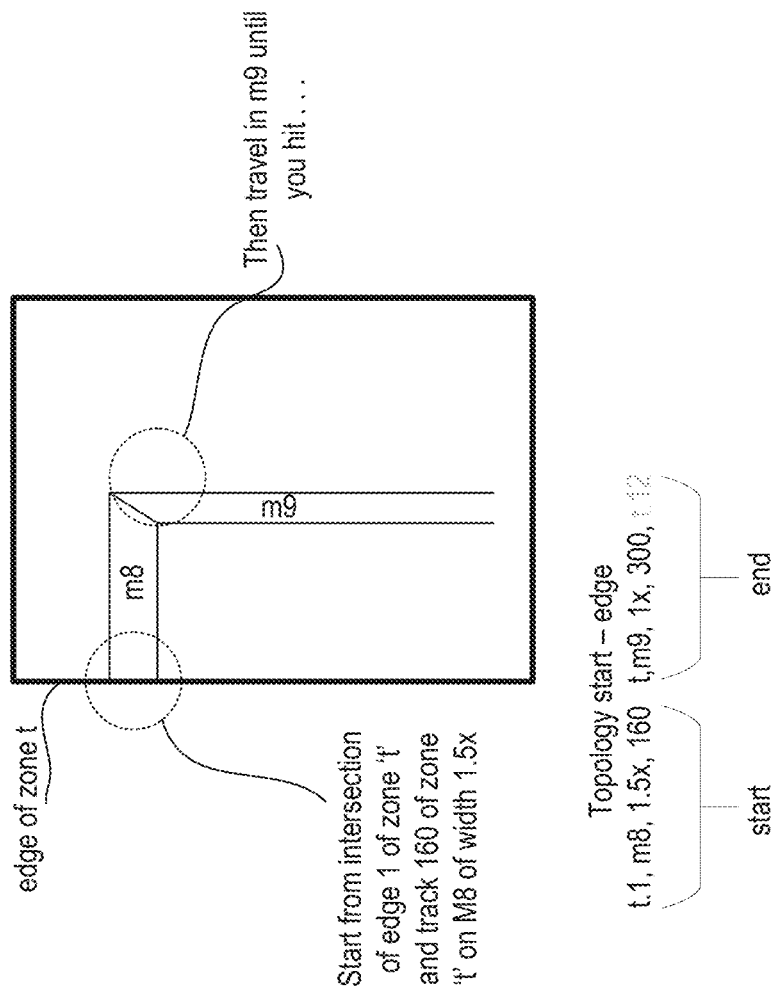
FIGS. 9-11 illustrate topology specifications, in accordance with some embodiments.
Figure 10:
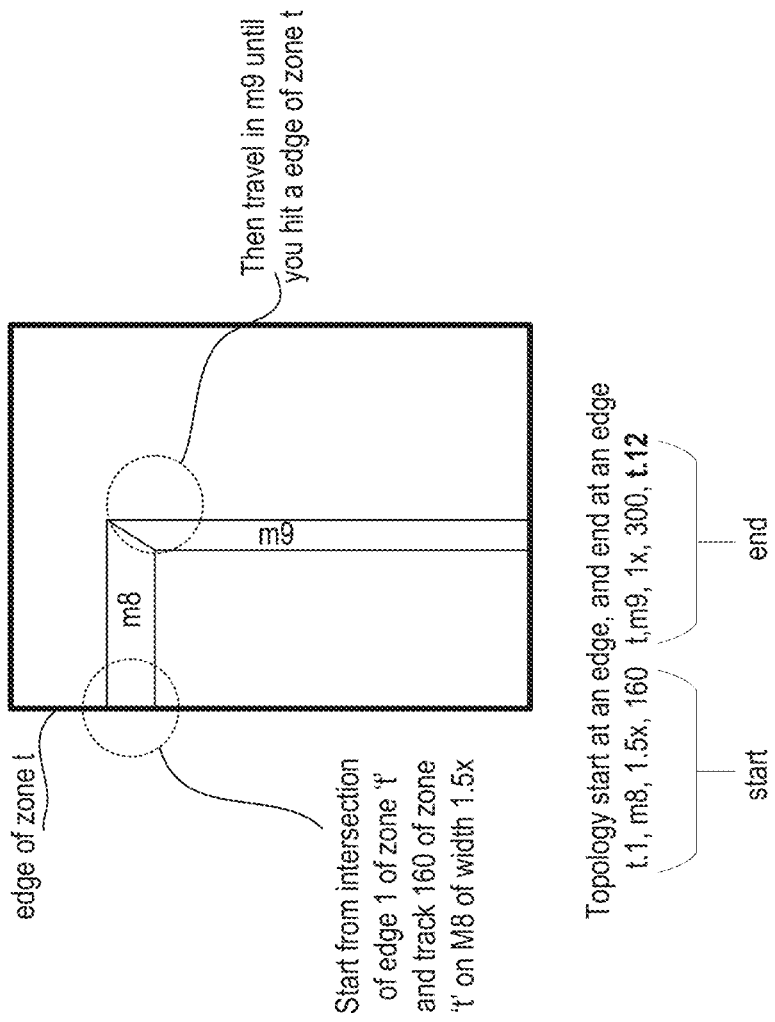
Figure 11:
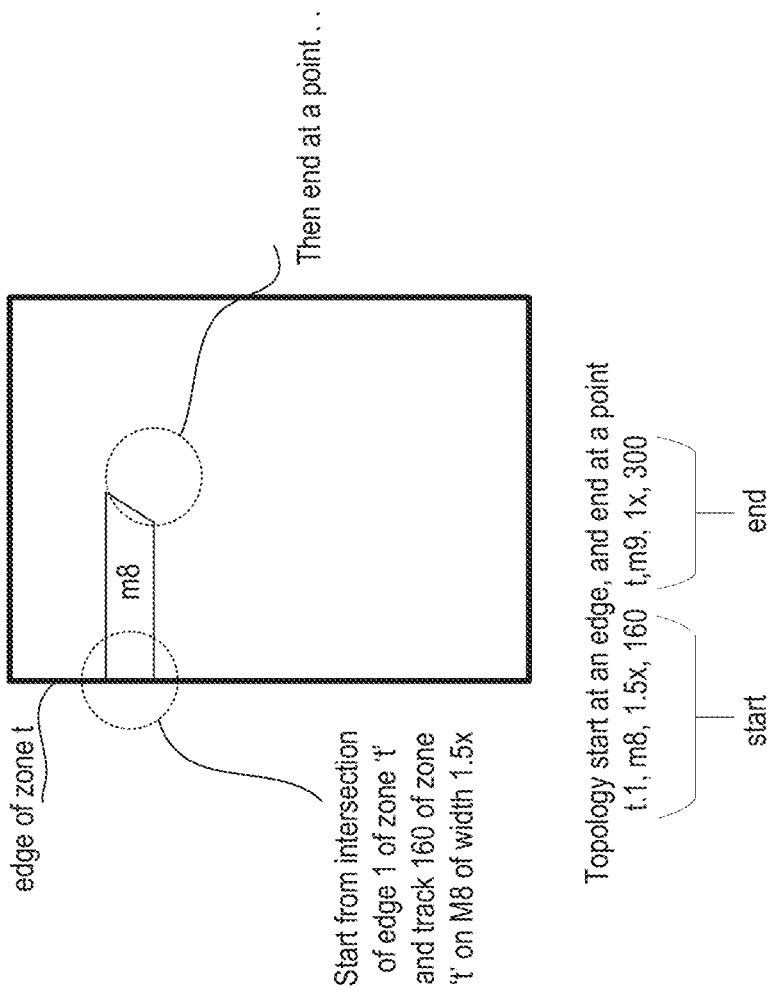
Figure 12:
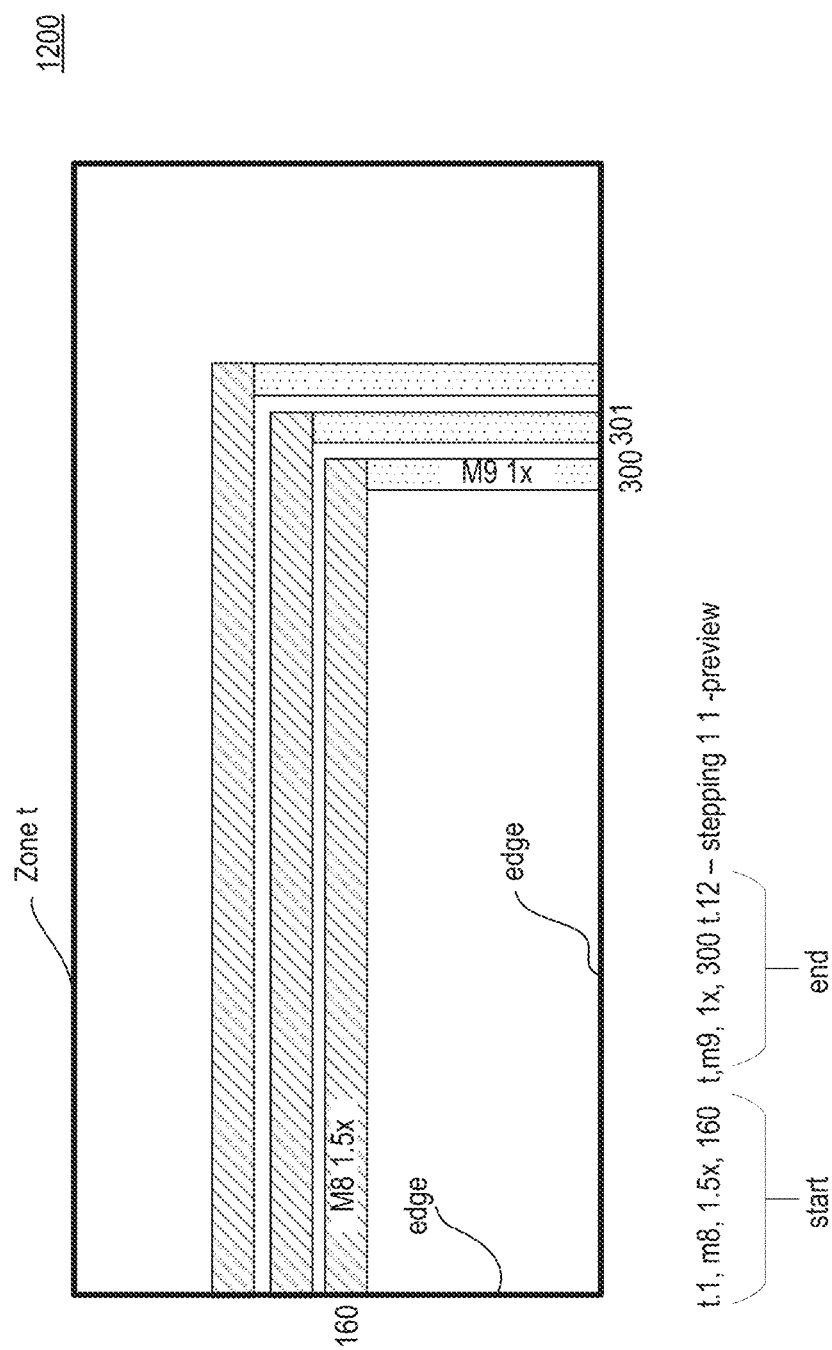
FIGS. 12-17 illustrate application of topology to nets with stepping, in accordance with some embodiments.
Figure 13:
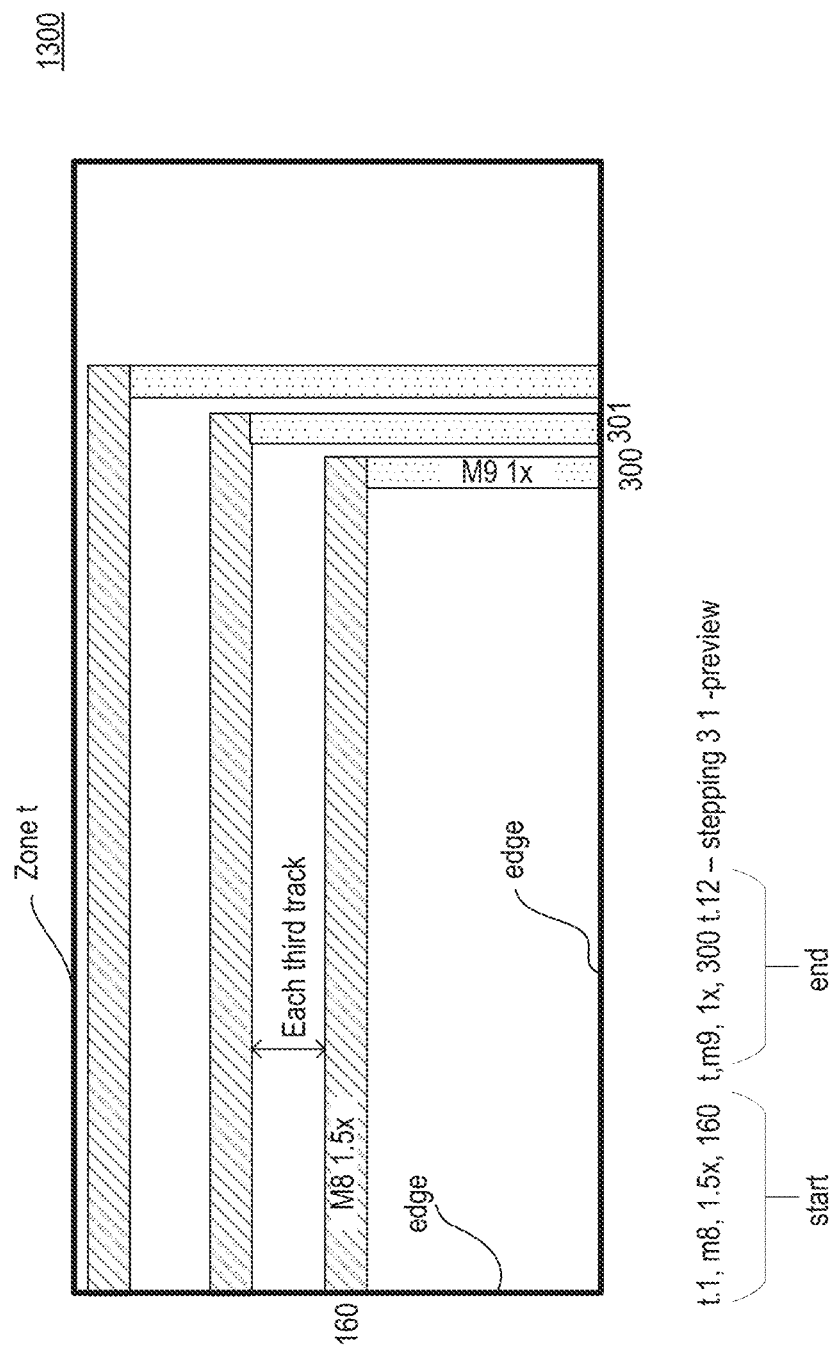
Figure 14:
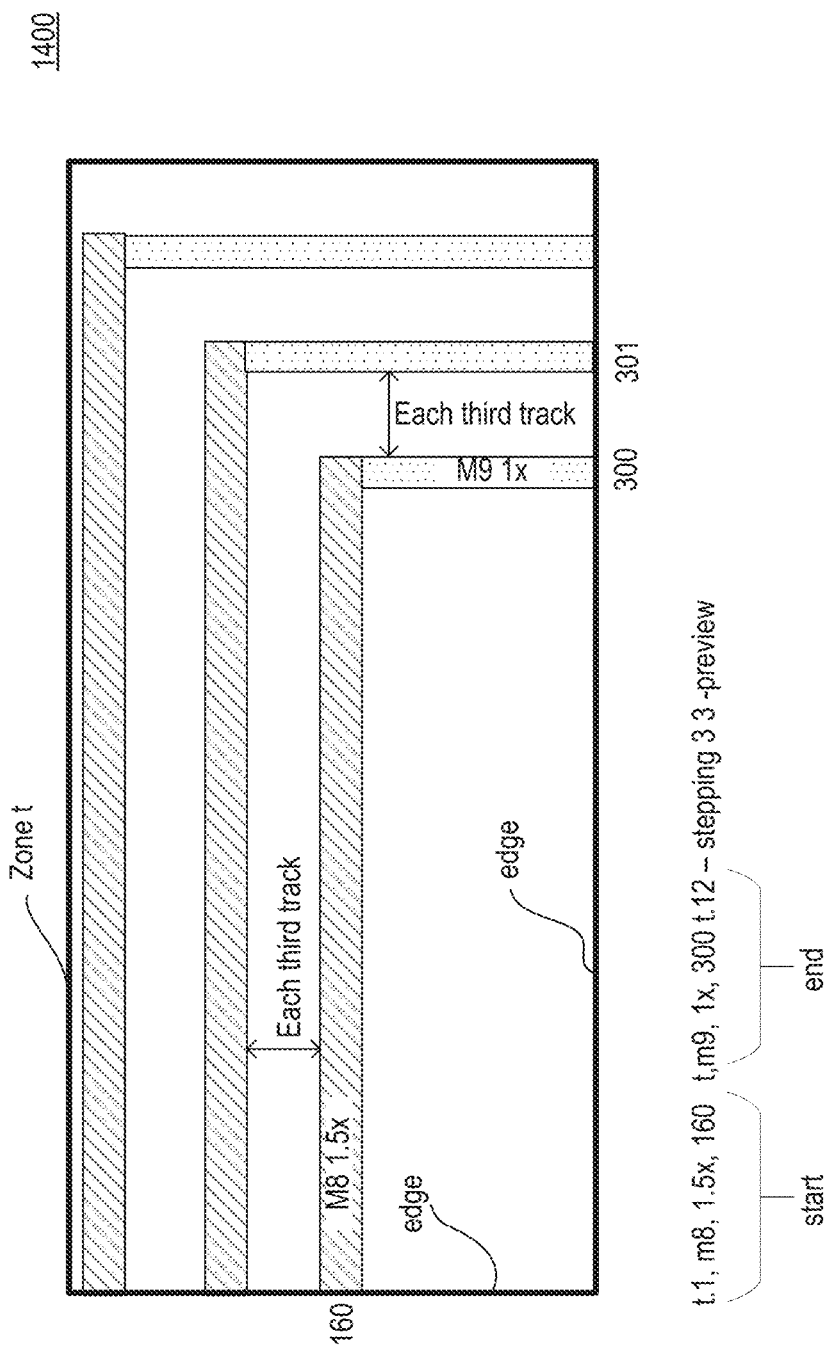
Figure 15:
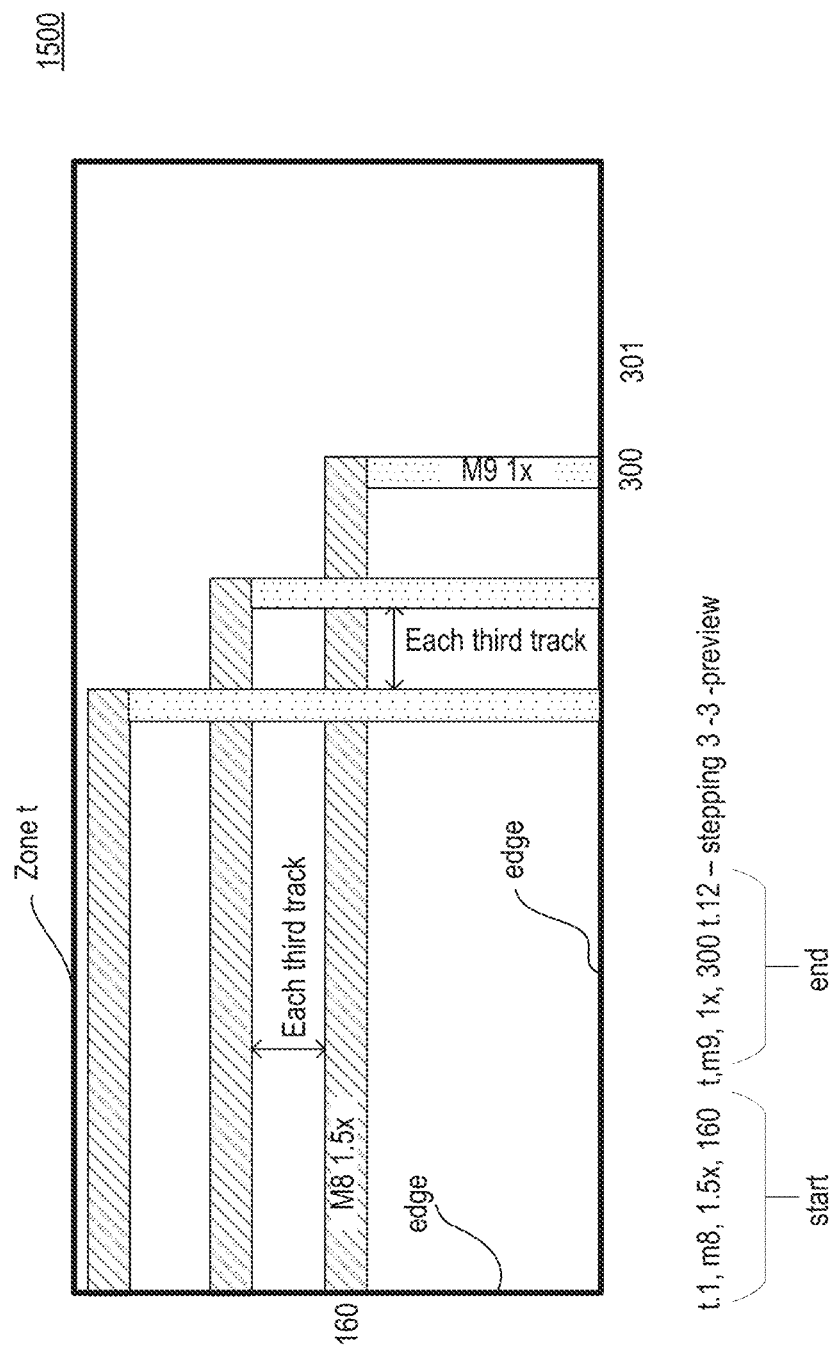

FIGS. 9-11 illustrate various topology specifications 900, 1000, and 1100, respectively, in accordance with some embodiments. Topology specification "t.1,m8,1.5x,160" describes the start at edge of zone 1 as shown in FIG. 9. The topology specification describes a track that start from intersection of edge 1 of zone 't' and track 160 of zone '6' on metal layer m8 of width 1.5x. The topology specification also provides an end point "t,m9,1x,300 t12" which describes that to reach the end, travel in m8 of width 1.5× until the track hit track 300 of zone 't' on m9 of width 1×.

Topology specification "t.1,m8,1.5x,160 t,m9,1x,300 t.12" describes the start from intersection of track 160 of m8 width 1.5× and track 300 of m9 width 1× of zone 1 as shown in FIG. 10. Here, to reach the end the track travels in m9 width 1× until the next condition is satisfied.

Topology specification "t.1,m8,1.5x,160 t,m9,1x,300 t.12" describes the start from intersection of track 160 of m8 width 1.5× and track 300 of m9 width 1× of zone 1 as shown in FIG. 11. Here, to reach the end the track travels in m9 width 1× until the next condition is satisfied. Topology specification "t.1,m8,1.5x,160 t,m9,1x,300" describes the start from intersection of edge 1 of zone 't' and track 160 of zone 't' on m8. The track then travels in m8 width 1.5× until the track hits 300 of zone 't' on m9 of width 1×.

FIGS. 12-17 illustrate applications 1200, 1300, 1400, 1500, 1600, and 1700, respectively, of topology to nets with stepping, in accordance with some embodiments. Here, the topology defines a reference topology. Here, the topology applies to the first net in "-nets". When more than one net -nets "foo[0:15] is passed, the topology for all subsequent nets are derived from the reference topology using a stepping option. The "-stepping" option is per segment of the "-topology". Any coordinate reference in topology is incremented by the correspondent stepping value. If the "-stepping" value is not supplied, the default is stepping of '1' for each segment.

FIGS. 12-15 provide stepping examples of "3 1", "3 3", and "3-3", respectively. An example command with "-stepping" option is described as follows: "-topology t.1,m8,1.5x, 160 t,m9,1x,300 t.12"-stepping "1 1"-preview -clear. Stepping can be both positive and negative and can even be '0'. A negative stepping revers the increment to next track to decrementing track by step value.

Stepping is a method to apply reference topology to consecutive nets supplied by the user through -nets command option. Stepping values are increments to reference topology coordinates. The lowest level of coordinate specified for the reference topology is either micron values or track numbers per layer and width relative to a zone. Stepping is applied for each coordinate of point in the reference topology by incrementing (for positive values of stepping) or decrementing (for negative values of stepping) each coordinate of the reference topology by the correspondent stepping values for each i+1 net in -nets.

Here is an example of how stepping is applied to 3-point topology for 3 nets, "a b c". Let's assume stepping values are 2-1 1 and coordinates are in track numbers. Let's assume that the reference topology uses track numbers N1, N2, N3. The reference topology is applied to the first net, "a". Then after applying stepping of 2-1 1, topologies for nets "a b c" will use track numbers as shown in the Table 4.

TABLE 4

| Net name | Track numbers | | |
| --- | --- | --- | --- |
| Net 'a' | N1 | N2 | N3 |
| Net 'b' | N1 + 2 | N2 − 1 | N3 + 1 |
| Net 'c' | N1 + 4 | N2 − 2 | N3 + 2 |

The same is applicable to coordinates in micron values. In that case, stepping values are in micron increments and not in track number increments.

Figure 16:
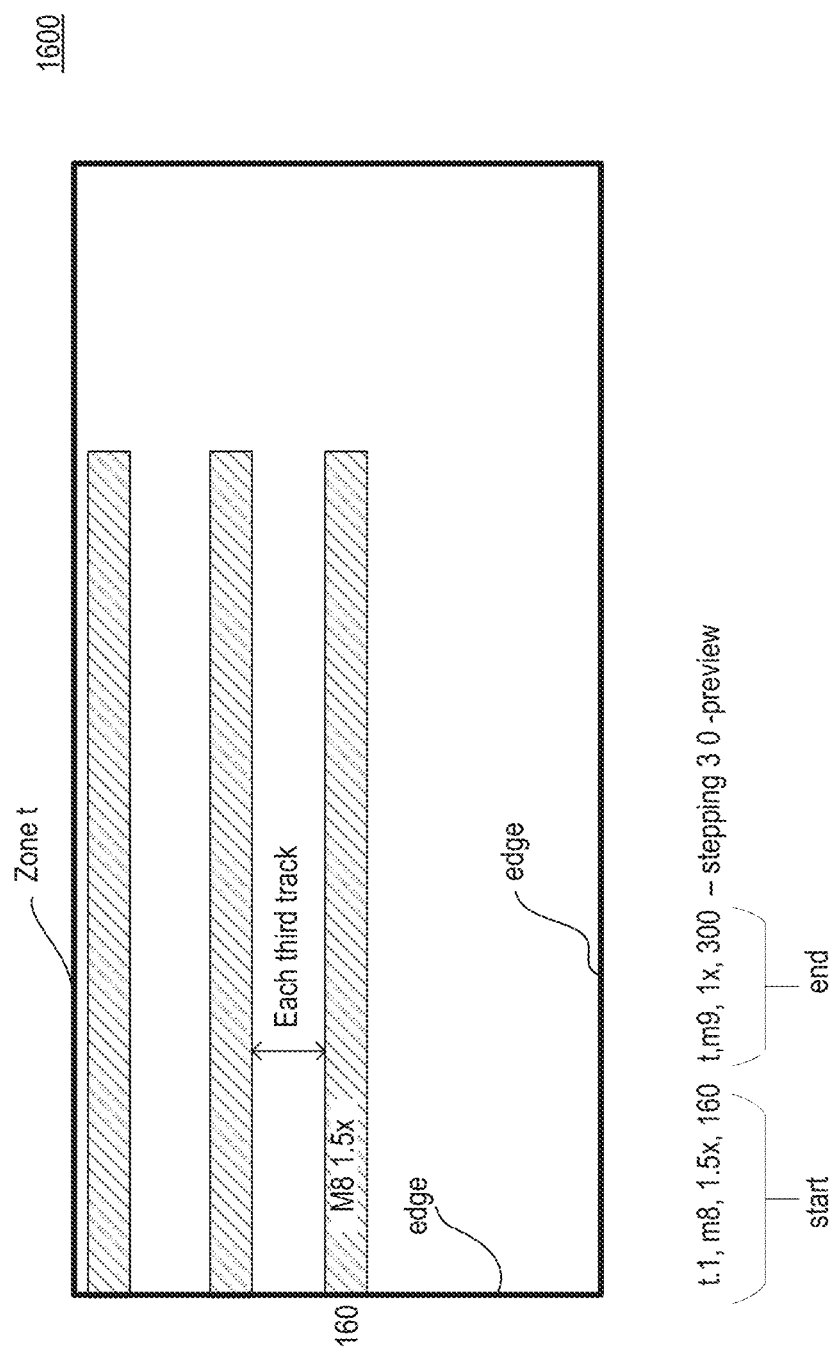
Figure 17:
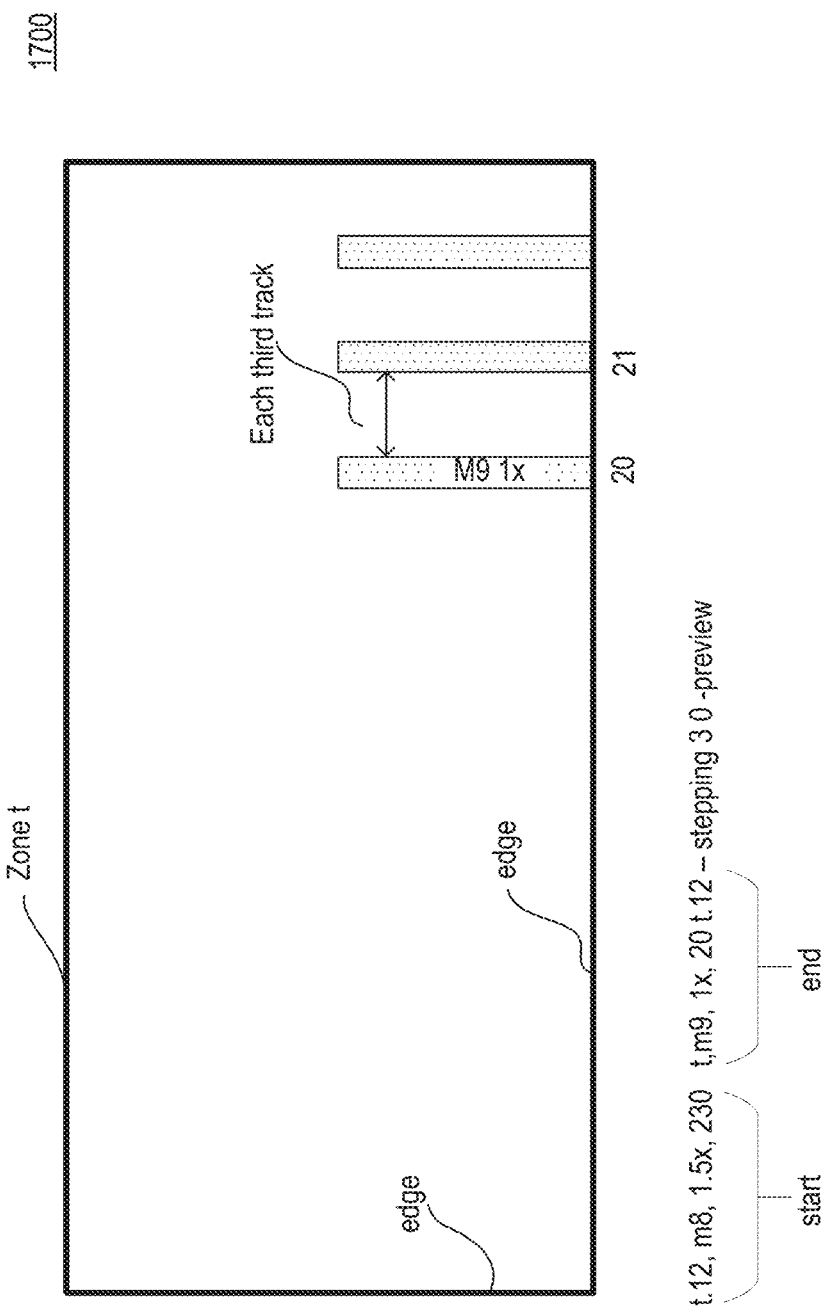

FIGS. 16-17 provide stepping examples of zero stepping. A zero stepping stops all segments at single track and will not step next segment. An example command with zero "-stepping" option is "t.1,m8,1.5x,160 t,m9,1x,300"-stepping "3 0"-preview -clear. The command generates a track that starts at edge 1 in m8 on track 160 of zone 't'. The track then travels until track 300 of m9 is hit, and then stops. At that point, track of m9 is not incremented for each bit in bus since stepping is zero. A stepping of zero is usually used to square off wires at the end so they stop at the same perpendicular track. Usually, stepping is used for extending trunks from ports or pins to a location followed by another h2t command to the previous trunks. Stepping is also used for matching length and parallel wires.

Various embodiments support a swizzle topology that is also known as twisted pair. This topology is used in dense channel routing for self-heating purposes. The swizzle works off pairs of nets on single segment topology description. The command has special option for swizzle, -swizzle, that takes relative distance in microns from start of topology layer/width of layer-1 swizzle layer.

Figure 18:
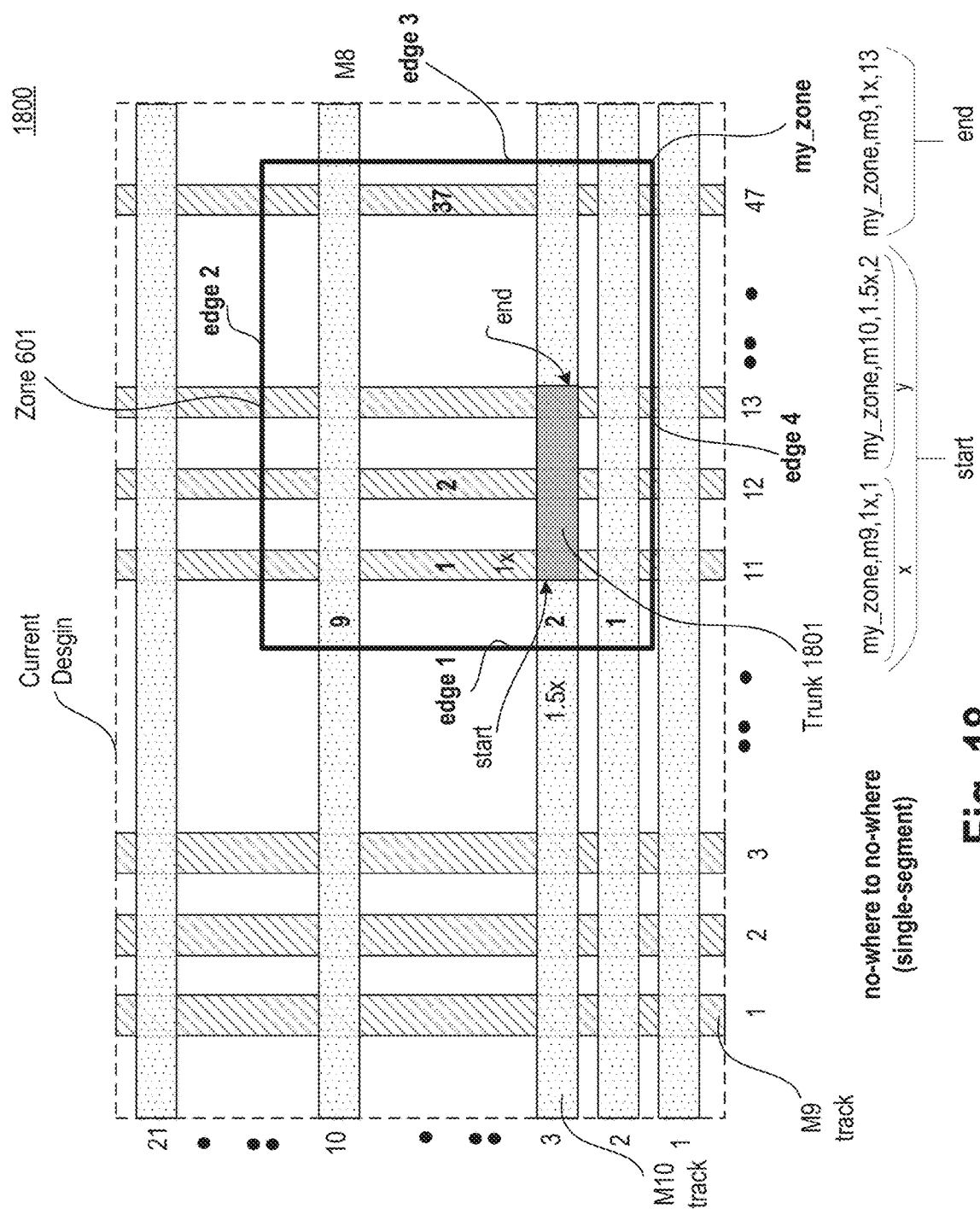
FIG. 18 illustrates a single segment topology from nowhere to no-where in a zone, in accordance with some embodiments.

FIG. 18 illustrates a single segment topology 1800 from no-where to no-where in a zone, in accordance with some embodiments. The command may read as: my_zone,m9, 1x,1 my_zone,m10,1.5x,2 my_zone,m9,1x,13. Trunk 1801 starts from intersection of my_zone track 1 of m9,1x and track 2 of m10,1.5x, travels in m10 until hitting track 13 of m9,1x.

Figure 19:
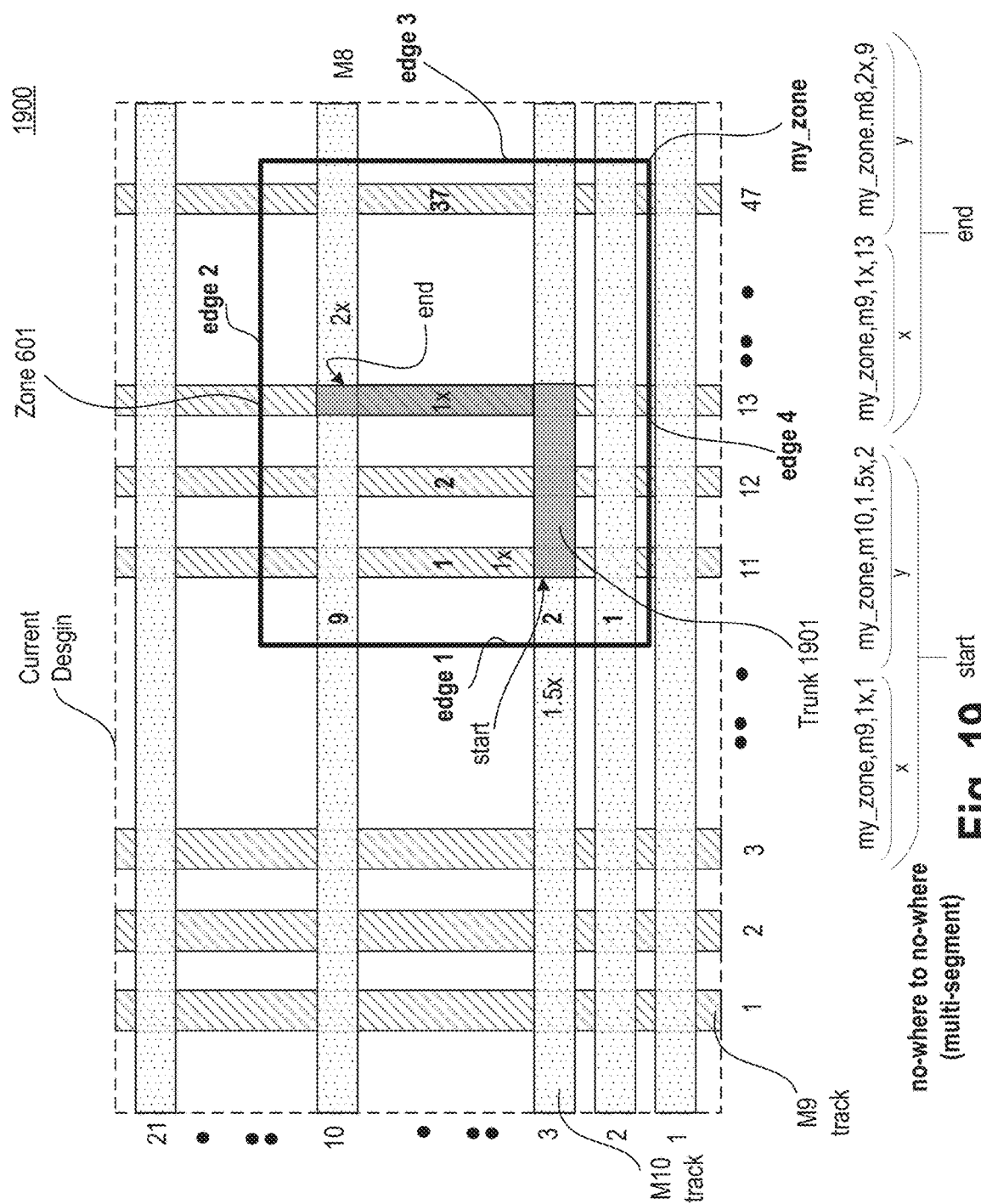
FIG. 19 illustrates a multi-segment topology in a zone, in accordance with some embodiments.

FIG. 19 illustrates a multi-segment topology 1900 in a zone, in accordance with some embodiments. The command may read as: my_zone,m9,1x,1 my_zone,m10,1.5x,2 my_zone,m9,1x,13 my_zone.m8,2x,9. Trunk 1901 starts from intersection of my_zone track 1 of m9,1x and track 2 of m10,1.5x, travels in m10 until hitting track 13 of m9,1x, then turns and travels in m9 until hitting track 9 of m8,2x.

Figure 20:
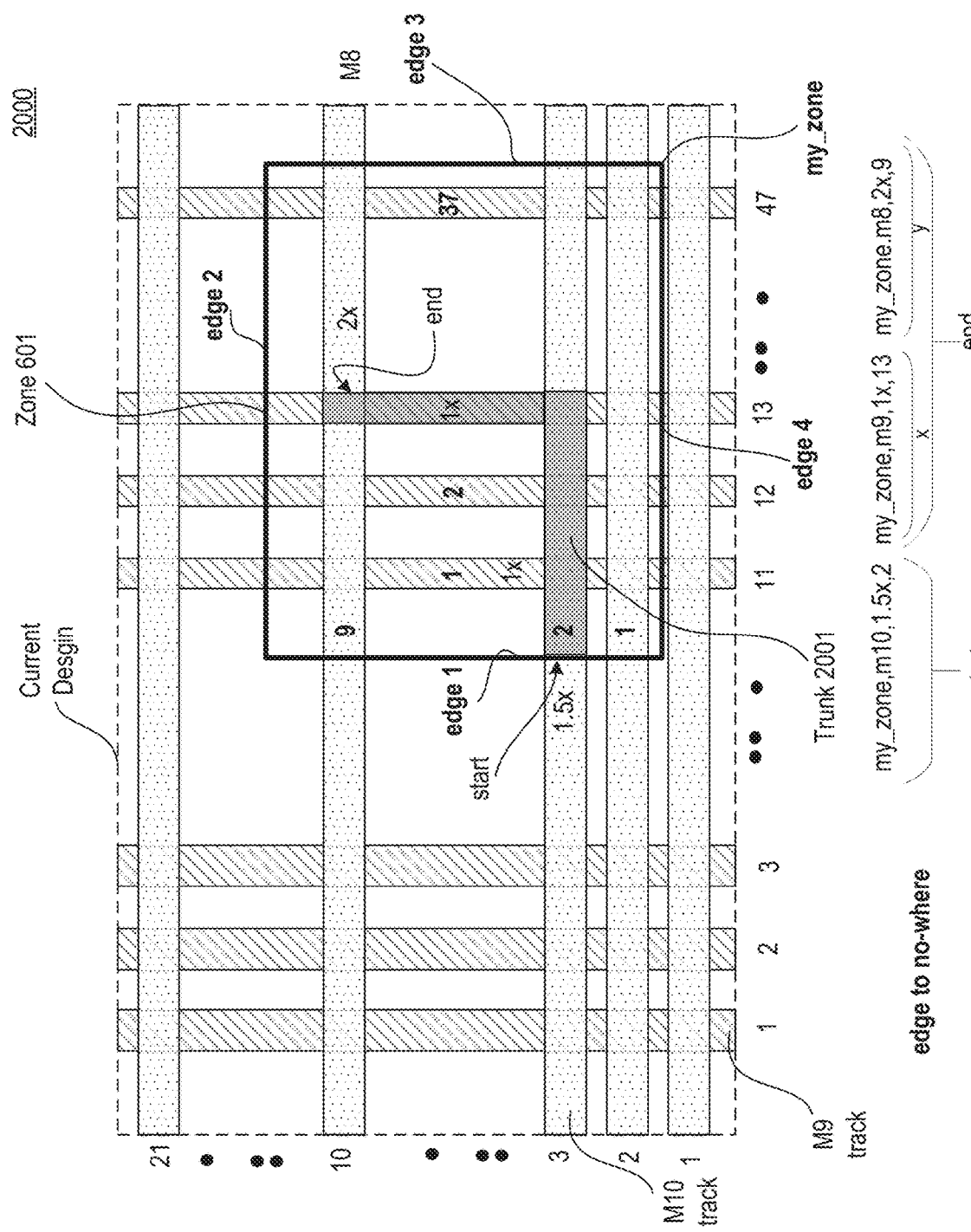
FIG. 20 illustrates a multi-segment topology starting from an edge and stopping at a track crossing, in accordance with some embodiments.

FIG. 20 illustrates a multi-segment topology 2000 starting from an edge and stopping at a track crossing, in accordance with some embodiments. The command may read as: my_zone,m10,1.5x,2 my_zone,m9,1x,13 my_zone.m8,2x,9. Trunk 2001 starts from intersection of my_zone edge 1 and track 2 of m10,1.5x, travels in m10 until hitting track 13 of m9,1x, then turns and travels in m9 until hitting track 9 of m8,2x.

Figure 21:
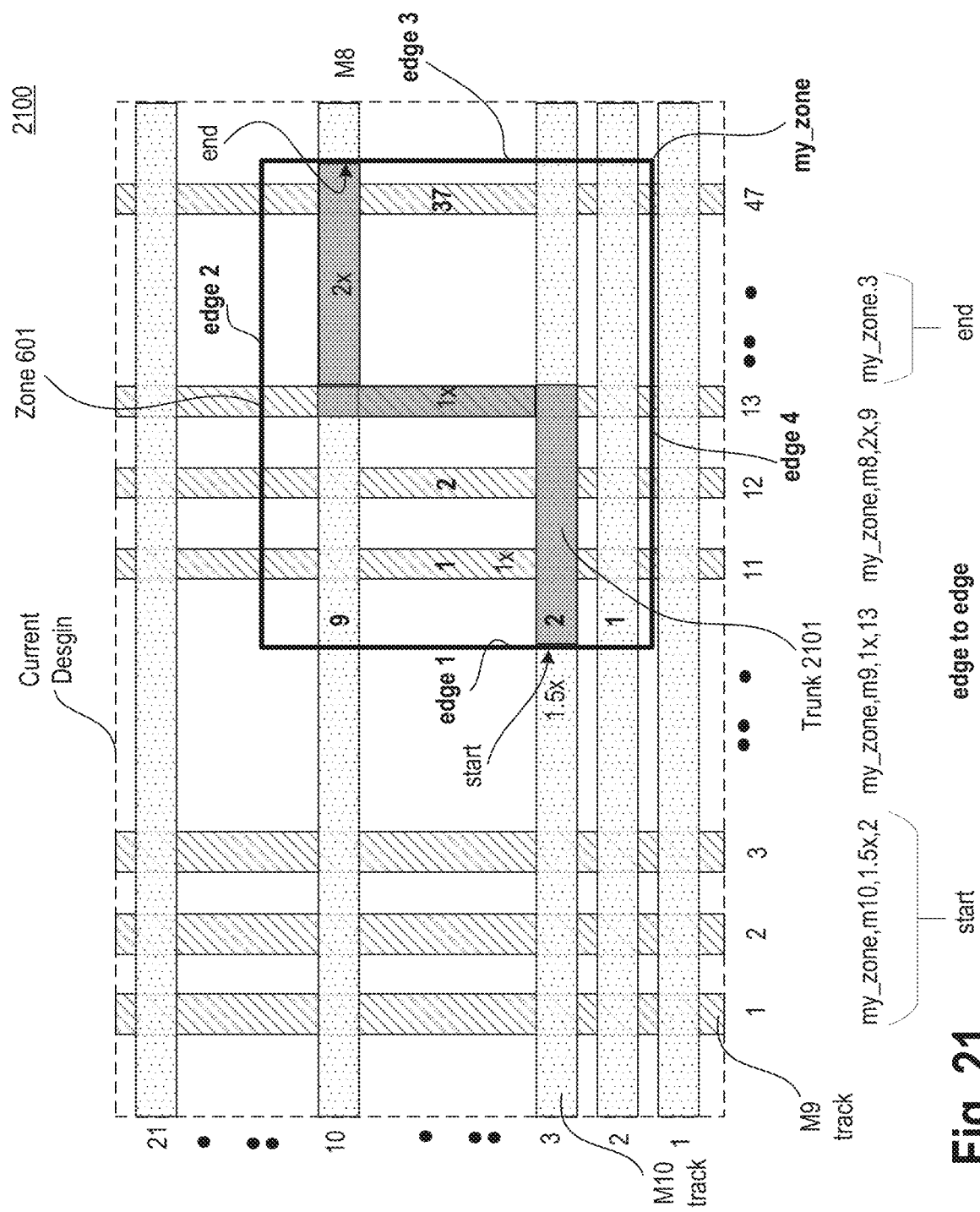
FIG. 21 illustrates a multi-segment topology starting from an edge and stopping at an edge of a zone, in accordance with some embodiments.

FIG. 21 illustrates a multi-segment topology 2100 starting from an edge and stopping at an edge of a zone, in accordance with some embodiments. The command may read as: my_zone,m10,1.5x,2 my_zone,m9,1x,13 my_zone,m8,2x,9 my_zone.3. Trunk 2101 starts from intersection of my_zone edge 1 and track 2 of m10,1.5x, travels in m10 until hitting track 13 of m9,1x, then turns and travels in m9 hitting track 9 of m8,2x, and then traveling on track 9 till edge 3 of my_zone.

Figure 22:
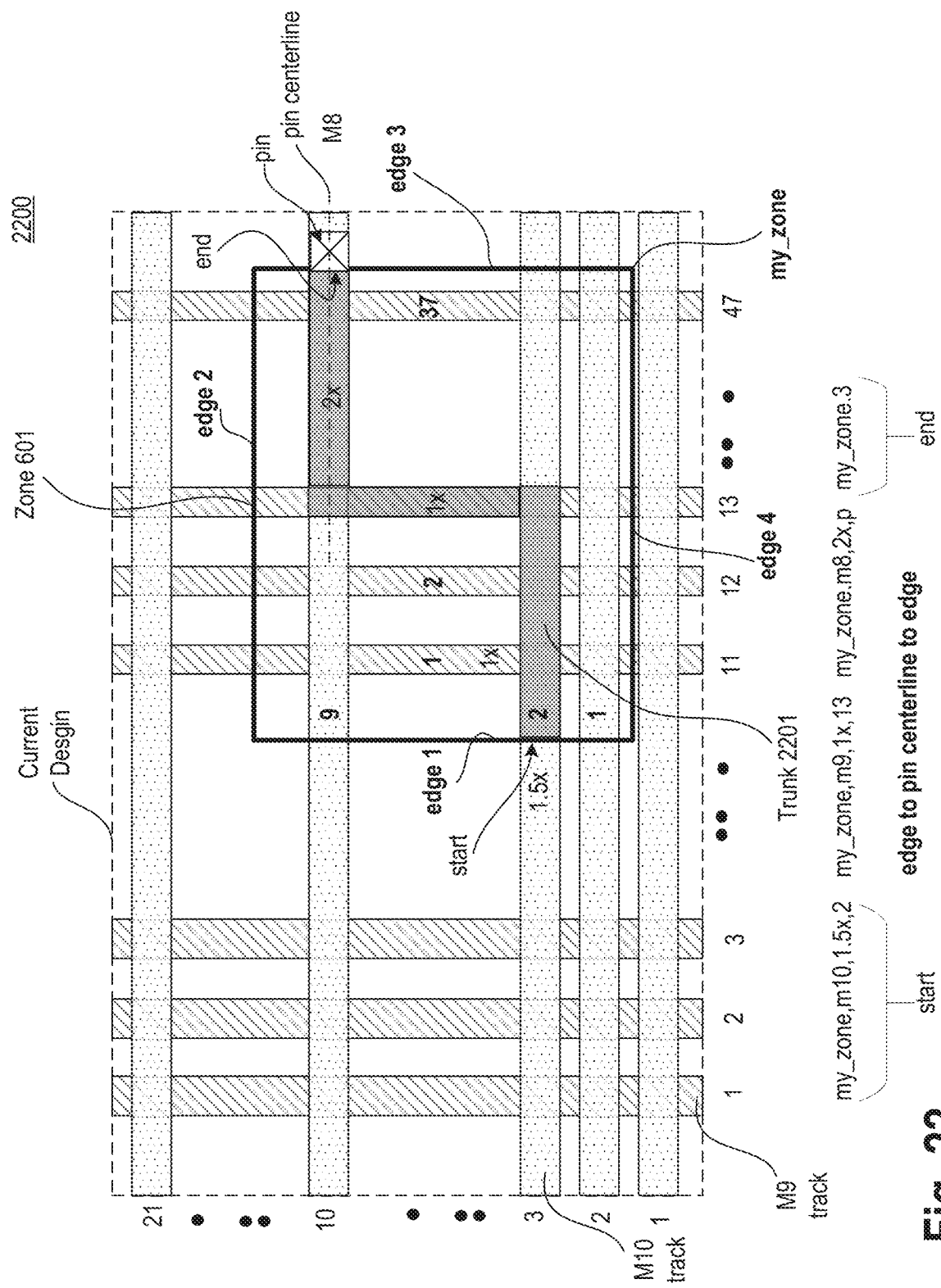
FIG. 22 illustrates a multi-segment topology starting at an edge and stopping at an edge along a pin centerline, in accordance with some embodiments.

FIG. 22 illustrates a multi-segment topology 2200 starting at an edge and stopping at an edge along a pin centerline, in accordance with some embodiments. The command may read as: my_zone,m10,1.5x,2 my_zone,m9,1x,13 my_zone.m8,2x,p my_zone.3. Trunk 2201 starts from intersection of my_zone edge 1 and track 2 of m10,1.5x, travels in m10 until hitting track 13 of m9,1x, then turns and travels in m9 until hitting track of the centerline of pin and then traveling till edge 3 of my_zone.

Figure 23:
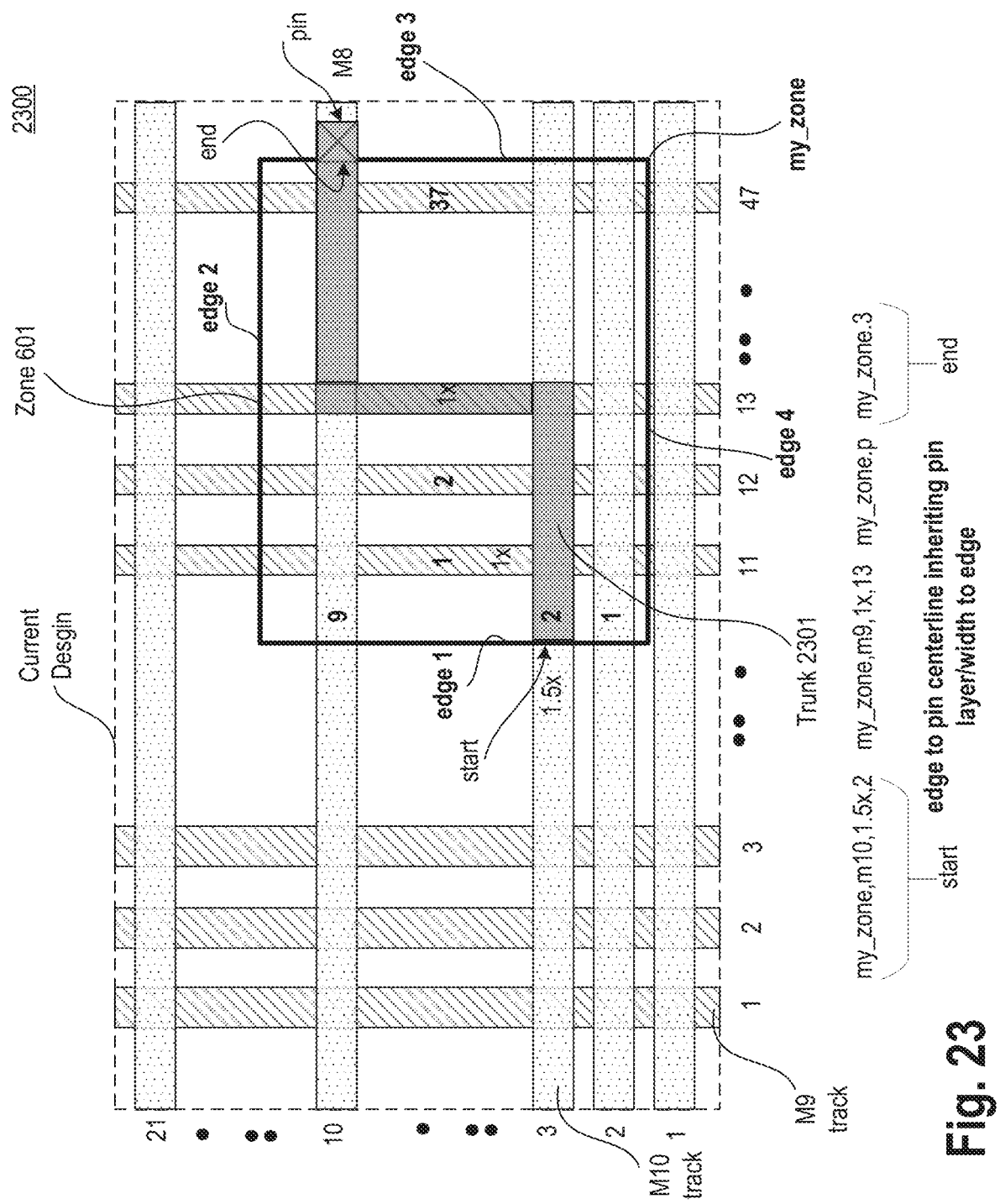
FIG. 23 illustrates a multi-segment topology starting at an edge and stopping at a pin then continuing to an edge, in accordance with some embodiments.

FIG. 23 illustrates a multi-segment topology 2300 starting at an edge and stopping at a pin then continuing to an edge, in accordance with some embodiments. The command may read as: my_zone,m10,1.5x,2 my_zone,m9,1x,13 my_zone.p my_zone.3. Trunk 2301 starts from intersection of my_zone edge 1 and track 2 of m10,1.5x, travels in m10 until hitting track 13 of m9,1x, then turns and travels in m9 until hitting track of the centerline of pin inheriting pins layer/width and hitting edge 3 of my_zone.

Figure 24:
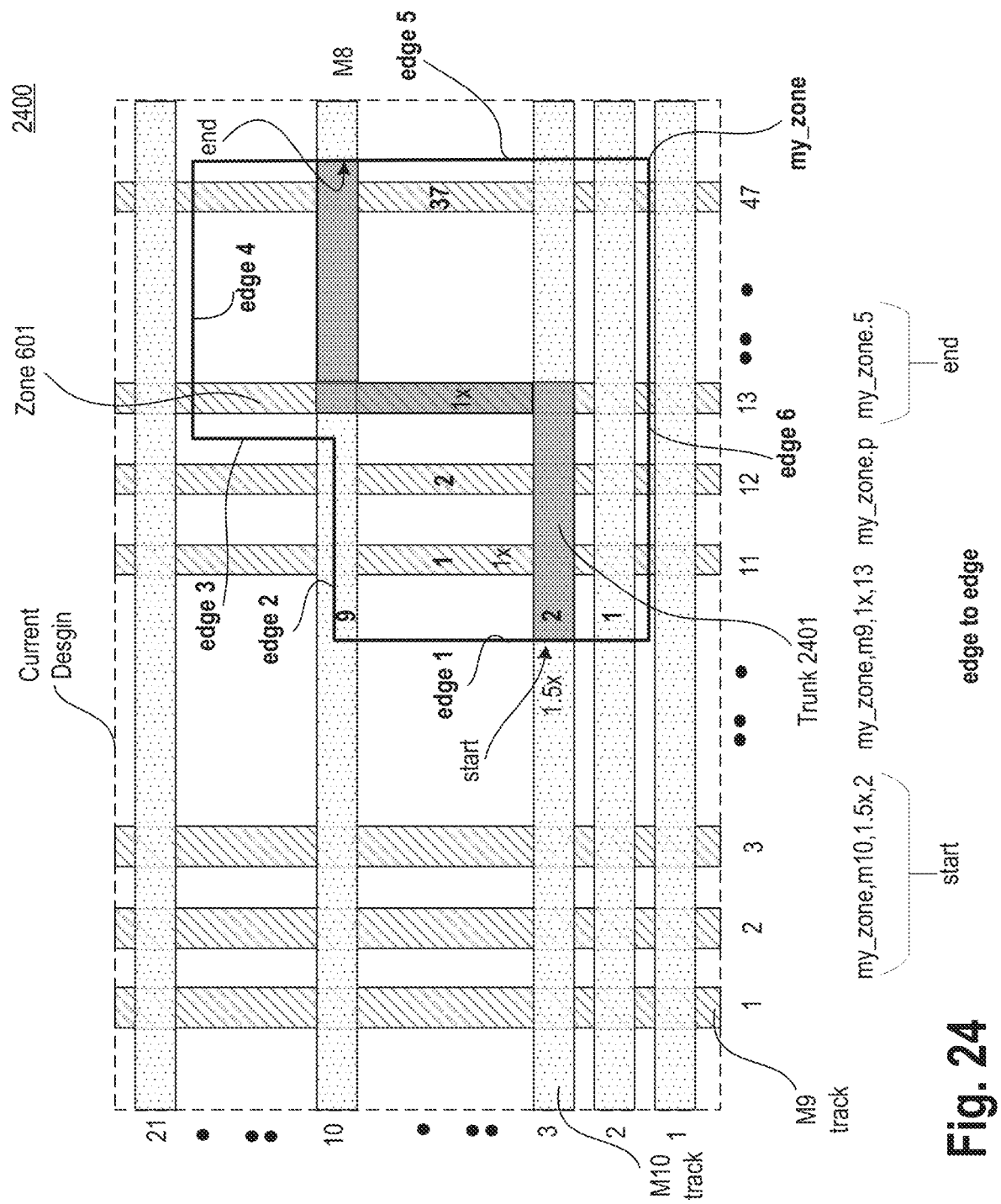
FIG. 24 illustrates a multi-segment topology starting on an edge and referencing another edge of the zone, in accordance with some embodiments.

FIG. 24 illustrates a multi-segment topology 2400 starting on an edge and referencing another edge of the zone, in accordance with some embodiments. The command may read as: my_zone,m10,1.5x,2 my_zone,m9,1x,13 my_zone.p my_zone.5. Trunk 2401 starts from intersection of my_zone edge 1 and track 2 of m10,1.5x, travels in m10 until hitting track 13 of m9,1x, then turns and travels in m9 until hitting edge 2 snapped to a track of m8,2x and then travel in m8 to edge 5.

Figure 25:
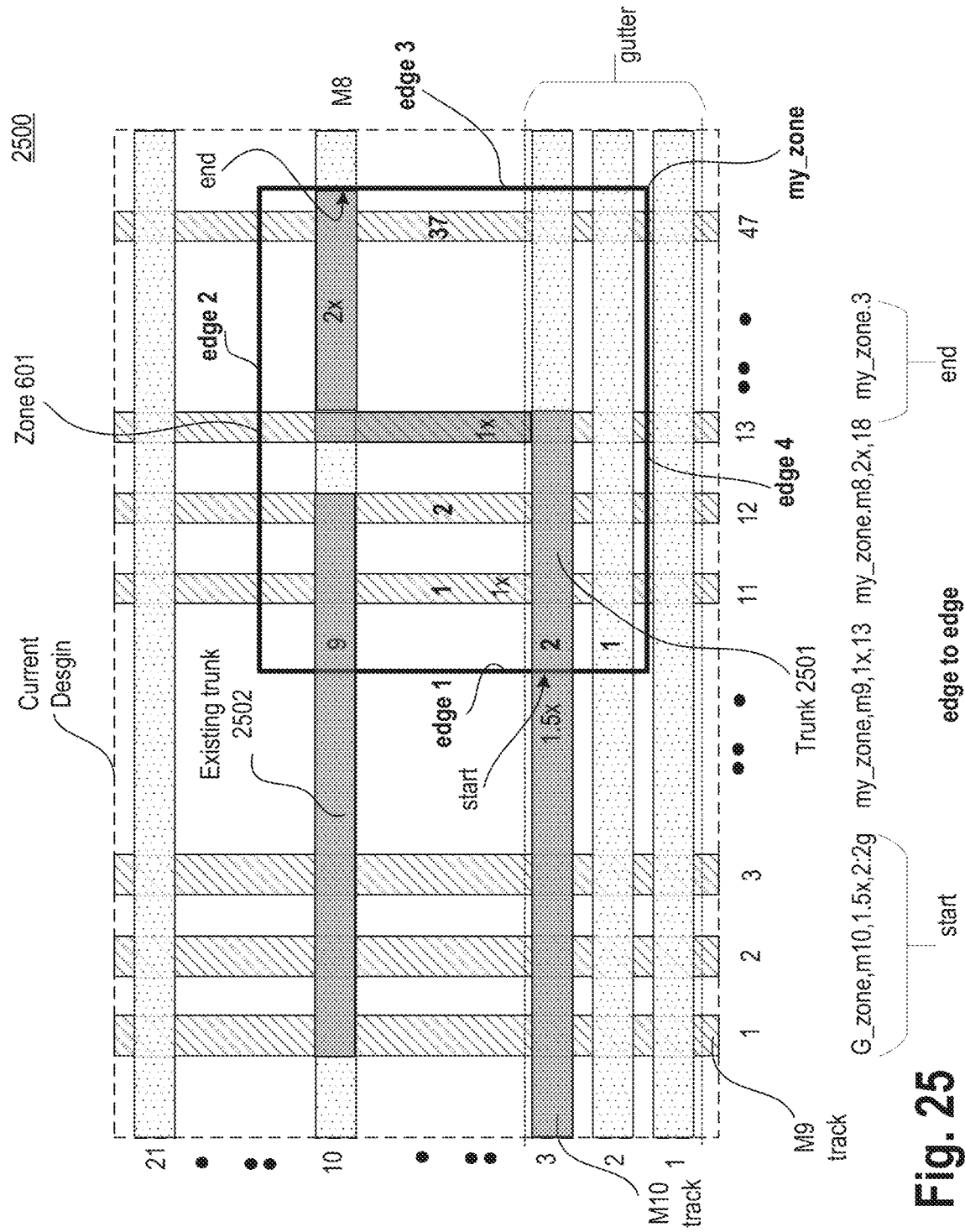
FIG. 25 illustrates a multi-segment topology referencing a truck with topology description, in accordance with some embodiments.

FIG. 25 illustrates a multi-segment topology 2500 referencing a truck with topology description, in accordance with some embodiments. The command may read as: G_zone, m10,1.5x,2:2g my_zone,m9,1x,13 my_zone.m8,2x,18 my_zone.3. Trunk 2501 starts from intersection of my_zone edge 1 and track 2 of m10,1.5x, travels in m10 until hitting track 13 of m9,1x, then turns and travels in m9 until existing trunk of m8/2x.

Figure 26:
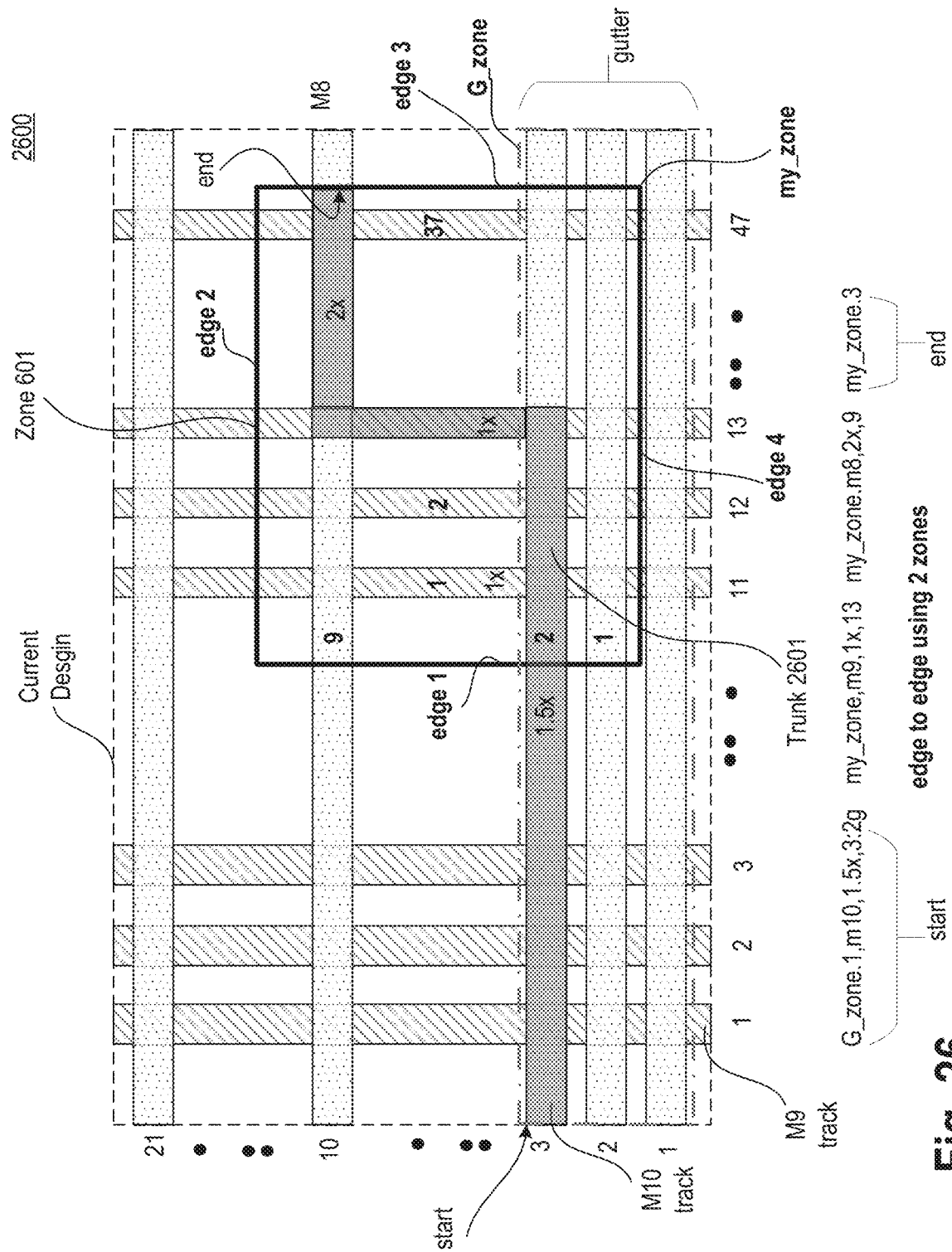
FIG. 26 illustrates a multi-segment topology referencing a gutter with topology information, in accordance with some embodiments.

FIG. 26 illustrates a multi-segment topology 2600 referencing a gutter with topology information, in accordance with some embodiments. The command may read as: G_zone.1,m10,1.5x,3:2g my_zone,m9,1x,13 my_zone.m8, 2x,9 my_zone.3. Trunk 2601 starts from intersection of G_zone edge 1 and track 2 of $2^{nd}$ gutter of m10/1.5x, travel in m10 until hitting track 13 of m9/1x then travel in m9 until hitting track 9 of m8/2x.

Figure 27A:
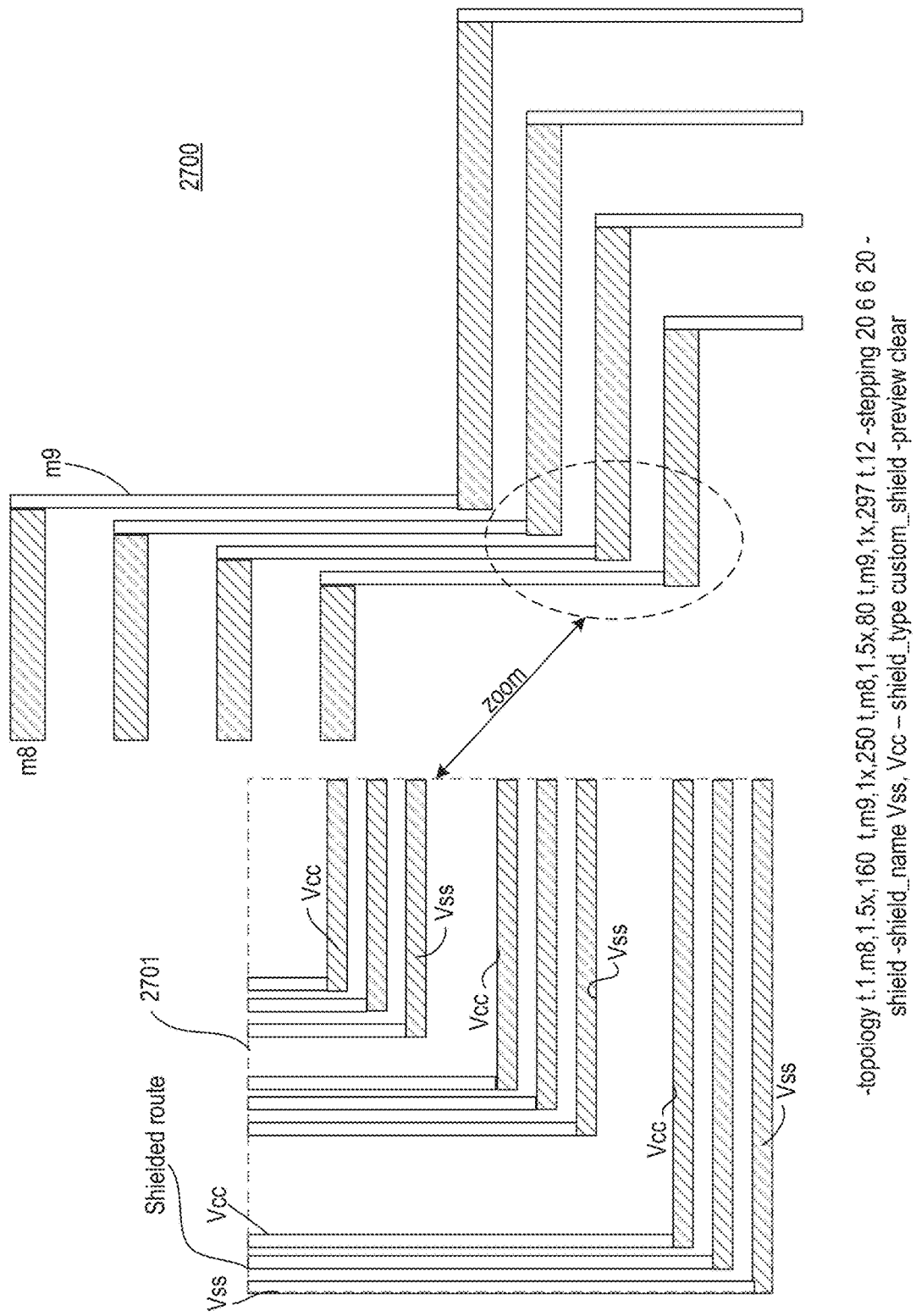
FIGS. 27A-B illustrate stair step topologies, respectively, with track sharing and shielding, in accordance with some embodiments.
Figure 27B:
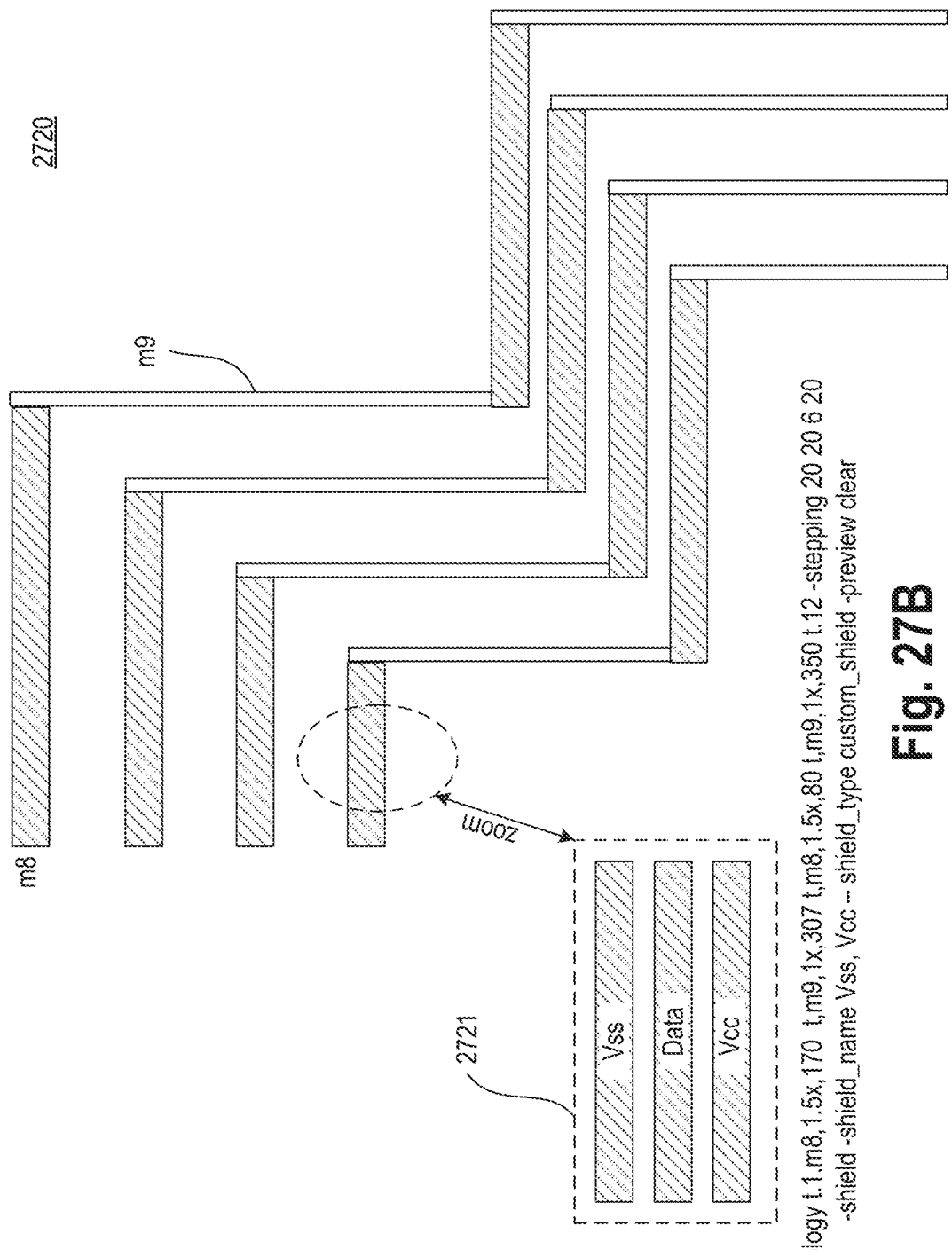

FIGS. 27A-B illustrate stair step topologies 2700 and 2720, respectively, with track sharing and shielding, in accordance with some embodiments. In some embodiments, data nets or signals of interest (e.g., analog signals) can be shielded by Vcc (supply) and/or Vss (ground). One example command for track sharing and shielding is: -topology t.1.m8,1.5x,160 t,m9,1x,250 t,m8,1.5x,80 t,m9,1x,297 t.12 -stepping 20 6 6 20 -shield -shield_name Vss, Vcc -shield_type custom_shield -preview clear. Here, m8 track is shared by Vcc, data (or shielded route) and Vss as shown in zoomed portion 2701. Same is true for m9. The command allows for stepping and sharing of routes to realize shielding, in accordance with some embodiments.

Shielding trunks are associated with the signal trunks they are shielding. Full and half shielding is designed by the -shield_name option. For full shielding, either a single name (if will place a shield trunk on the neighboring tracks on both sides of the signal trunk) or two shield names are provided separated by a comma. The shield name to the left of the comma goes left or bottom of the signal trunk depending on layer direction, and the shield name to the right of the comma goes to the right or top of the signal trunk. If there is a single shield name specified with a comma, the signal trunk is shielded on one side. If the shield name is on the left of the comma, the half shield is placed on the left or bottom of the signal trunk depending on the layer direction. If the shield name is to the right of the comma, the half shield is placed to the right or top of the signal trunk.

FIG. 27B illustrates another example of shielding on a shared net. The command used in this example is: -topology t.1.m8,1.5x,170 t,m9,1x,307 t,m8,1.5x,80 t,m9,1x,350 t.12 -stepping 20 20 6 20-shield -shield_name Vss, Vcc -shield_type custom_shield -preview clear. In this case m8 is shared by Vss, Data, and Vcc as shown in zoomed version 2721, where Data is shielded by Vss and Vcc on m8.

Figure 28:
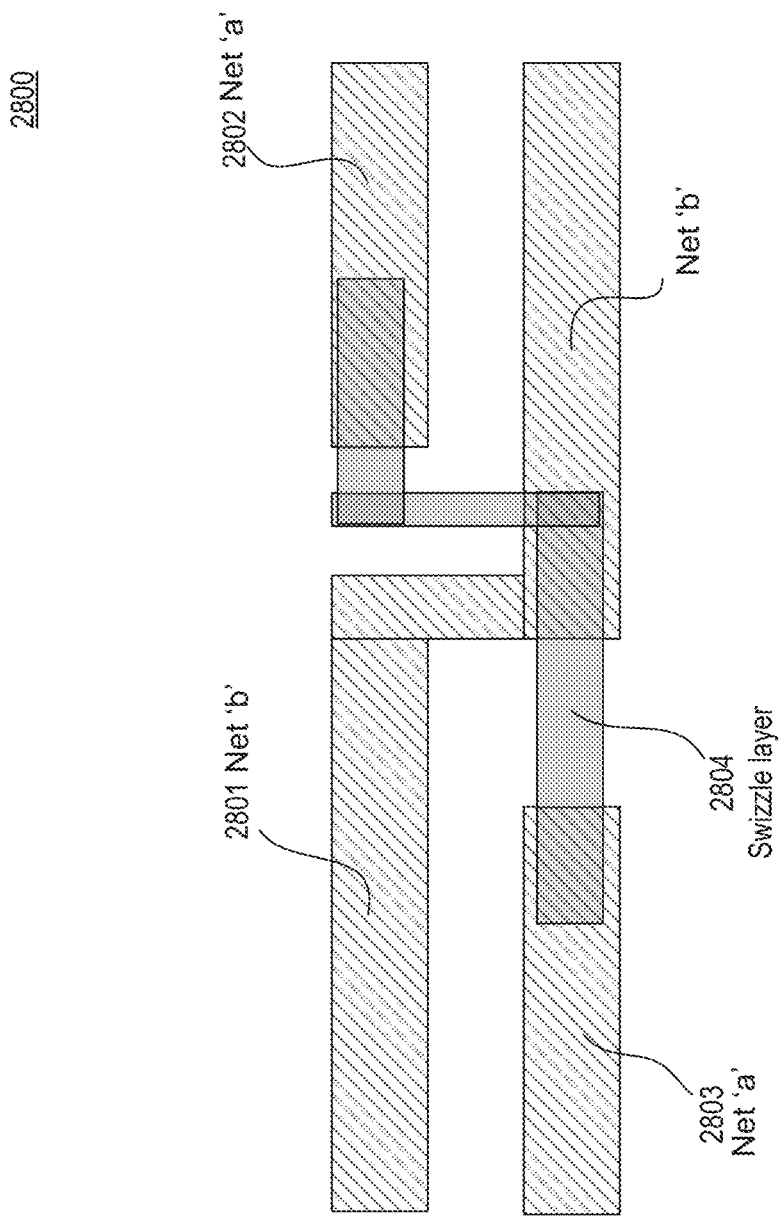
FIG. 28 illustrates a swizzle topology on a pair of net topologies, in accordance with some embodiments.

FIG. 28 illustrates swizzle topology 2800 on a pair of net topologies, in accordance with some embodiments. The command infrastructure allows to implement a swizzle topology that is also known as twisted pair, in accordance with some embodiments. Swizzle topology is used in dense channel routing for self-heating purposes. The swizzle works off pairs of nets (2801, 2802, 2803) on single segment topology description. The command has an option for swizzle, -swizzle, that takes relative distance in microns from start of topology layer/width of layer-1 swizzle layer 2804.

Swizzle is an automatic topology directive option to the command that will crisscross a pair of signals at a specified location when a straight single leg topology is passed. For example: netA starts in track 1, netB starts in track 2, if swizzle is passed, the topology layer and/or width is read along with user input for swizzle location relative to the topology starting point. netA will use tracks from an existing trunk topology layer. Via is dropped and non-preferred direction metal is drawn in a specified swizzle layer (either trunk layer plus one or trunk layer minus one, this is passed with -swizzle option) in a same direction. Then, track direction is turned using the swizzle layer on a swizzle layer legal track. The tool then draws the non-preferred direction trunk in the swizzle layer. A via is then dropped and the track continues in topology trunk layer to the desired end point in the topology description. netB will draw trunk from a start point in the topology layer on track 2 and when it reaches the swizzle location, non-preferred direction trunk is drawn in a same trunk layer (using swizzle layer legal track) to jog down to track 1. Once at track one, the topology continues to use the same trunk layer and complete the trunk to the topology end point using track 1 of trunk layer.

Figure 29A:
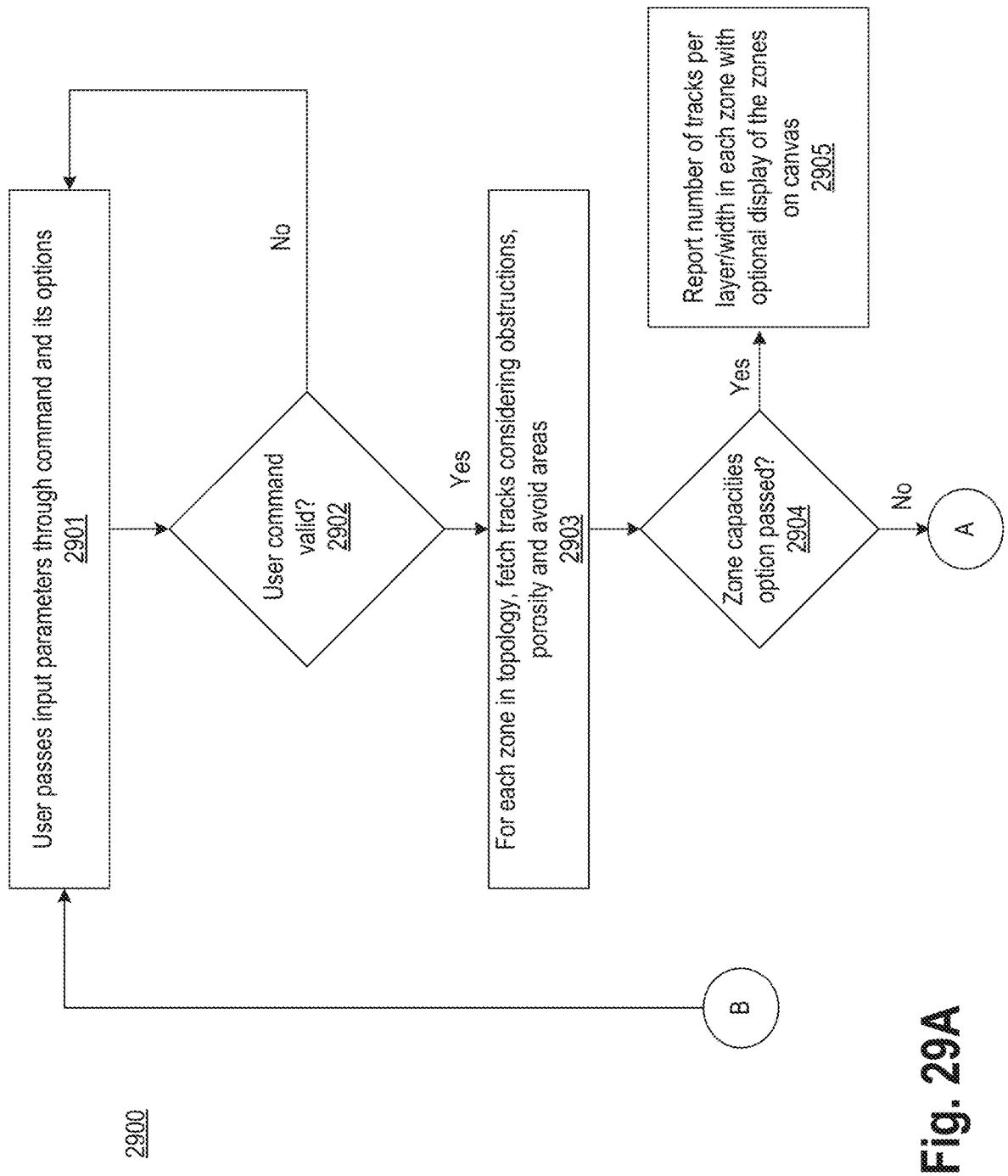
FIGS. 29A-C illustrate a flowchart of a method for generating intent driven trunk topology, in accordance with some embodiments.
Figure 29B:
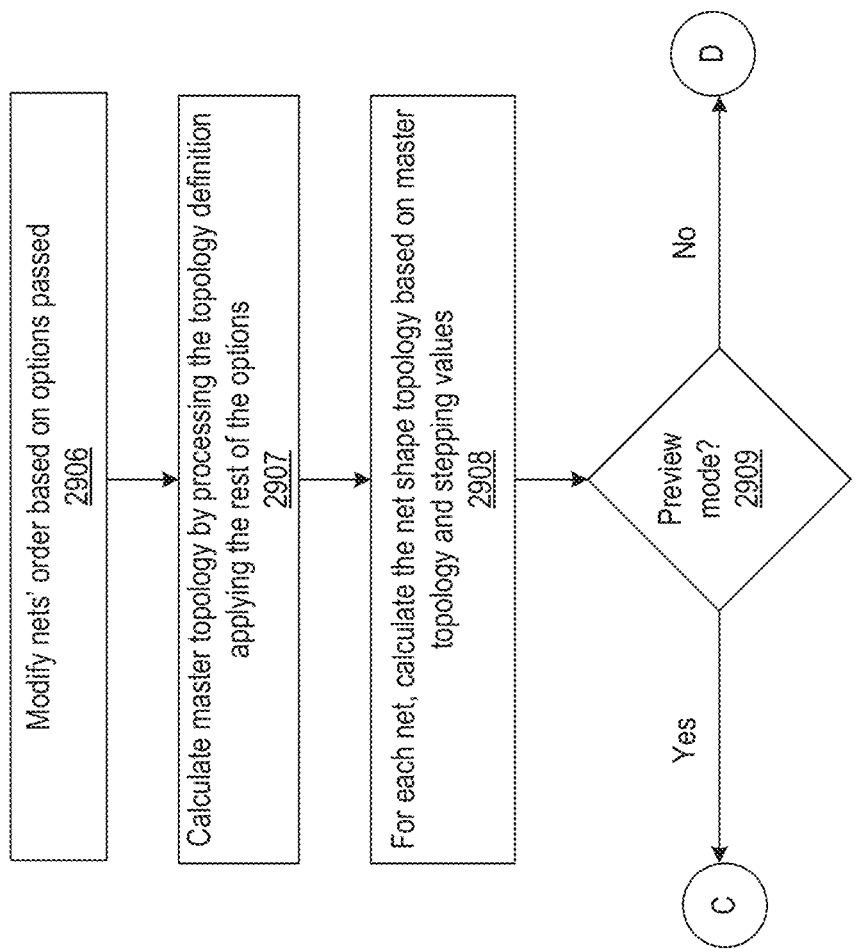
Figure 29C:
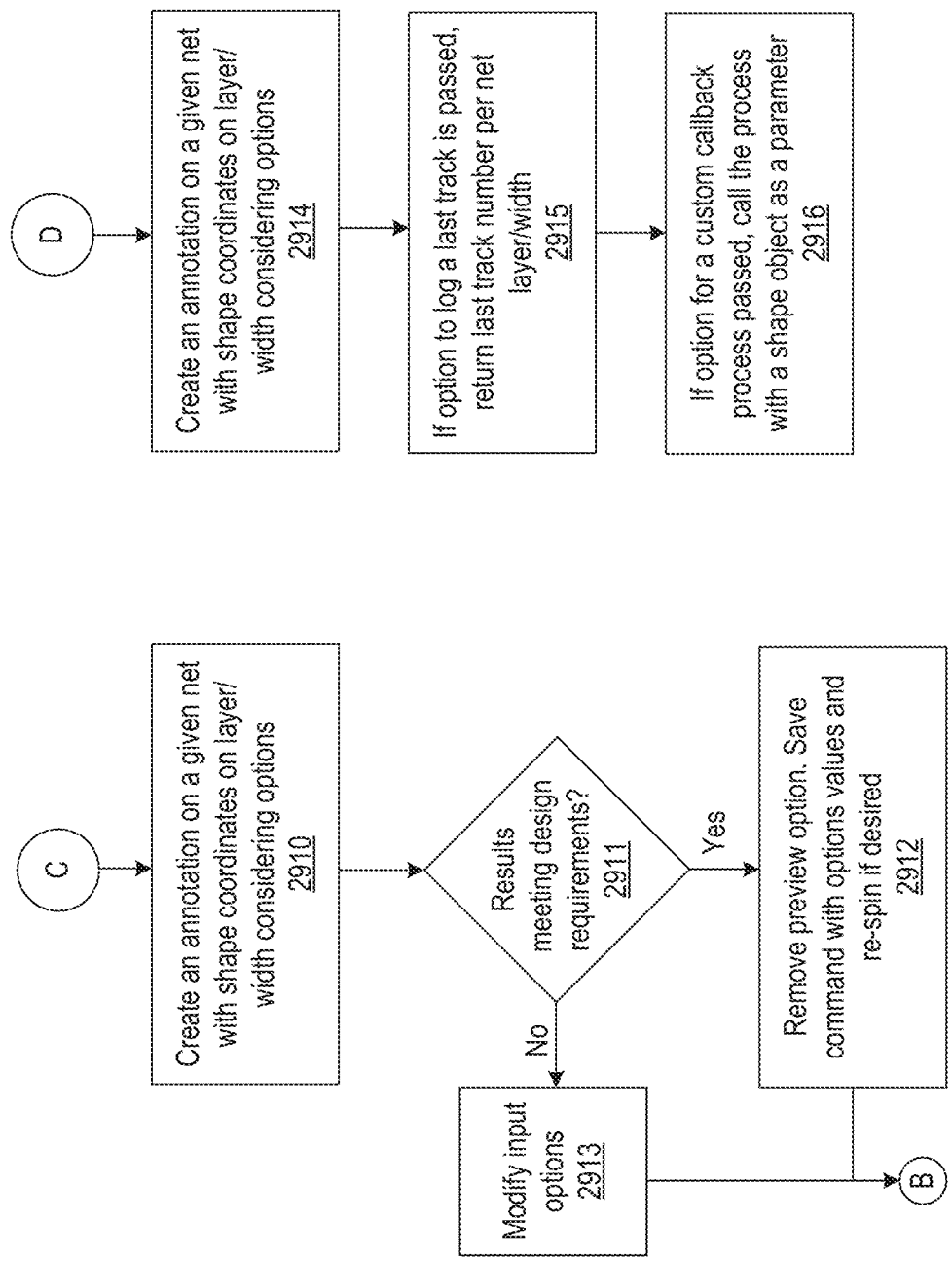

FIGS. 29A-C illustrate flowchart 2900 of a method for generating intent driven trunk topology, in accordance with some embodiments. While the blocks are shown in a particular order, the order can be modified. For example, some blocks may be performed in parallel while other blocks may be performed out of order.

At block 2901, user passes input parameters through the command as discussed herein and its options. At block 2902, the user command is verified for validity. For example, zone definition is processed to make sure the zones actually exist and the geometry is valid, process topology definition is processed to ensure syntax is correct to get tracks in terms of layer and width and to make sure the tracks exist, processor the stepping definition to make sure stepping maps to topology legs, and to process the rest of command options. If the command is valid, the process proceeds to block 2903. Otherwise, the process proceeds to block 2901. At block 2903, for each zone in the topology, fetch tracks considering obstructions, porosity, and avoid (no-go) areas. At block 2904, a determination is made regarding whether report zone capacities option is passed. If the report zone capacities option is passed in the command, then the process proceeds to block 2905 where number of tracks per layer/width in each zone is reported with optional display of the zones on a canvas (or graphical user interface). If the report zone capacities option is not passed in the command, the process proceeds to block 2906 as referred to by indicator A.

At block 2906, nets' order is modified based on options passed. Such options include: interleave, reverse, bus expand, reference nets mapped, number of trunks per net, etc. At block 2907, master topology is calculated by processing the topology definition applying the rest of the options (e.g., shielding, swizzle, etc.). At block 2908, for each net, the net shape topology is calculated based on master topology and stepping values. At block 2909, a determination is made regarding whether preview mode was enabled. If preview mode is enabled, the process proceeds to block 2910 as referred to by indicator C, otherwise the process proceeds to block 2914 as indicated by indicator D.

At block 2910, an annotation is created on a given net with shape coordinates on layer/width considering options. At block 2911, a determination is made regarding meeting design requirements. If the design requirements are met, the preview option is removed, and the command with options values (and parameters) are saved for re-spin or re-do of the same analysis as indicated by block 2912. The process then proceeds to block 2901 as indicated by indicator B. If the results do not meet design requirements, the user can change the input parameters and/or options in the command at block 2913 and proceed to redoing the intent driven process as indicated by indicator B.

At block 2914, an annotation is created on a given net with shape coordinates on layer/width considering options. At block 2915, if option to log a last track is passed, the tool returns the last rack number per net layer/width. In case of complex trunking (usually with track sharing and shielding), several trunking commands are called one after another to achieve the desired outcome. Each consecutive command often uses the result and state of the previous command as a starting or reference point. The state of a command is characterized by the set of last track numbers used by the command In this case, return_last_track_number option is used to enable interdependent chain of commands that represents a trunking recipe.

If an option for custom callback process passed, the tool calls the process passed as indicated by block 2916. Custom callback is used to post-process the results of a trunking command, usually for the purpose of mark-up, maintenance, quality assessment or any bulk processing of the resulting trunks. Custom callback is a procedure, e.g., a TCL procedure, that is passed a collection of trunk objects generated by the command.

Figure 30:
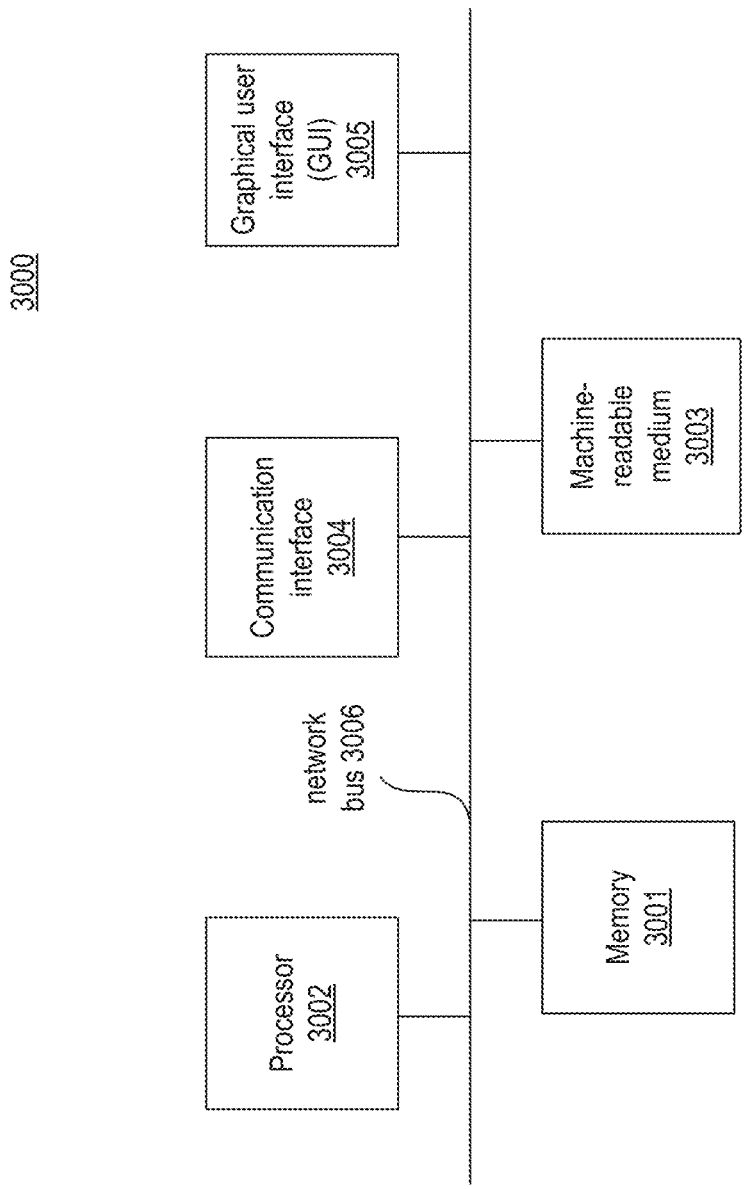
FIG. 30 illustrates a computer system with machine-readable storage media having machine-executable instructions for generating intent driven trunk topology, in accordance with some embodiments.

FIG. 30 illustrates a computer system with machine-readable storage media having machine-executable instructions for generating intent driven trunk topology, in accordance with some embodiments. Elements of various embodiments are also provided as a machine-readable medium (e.g., memory) for storing the computer-executable instructions (e.g., instructions to implement any other processes discussed herein). In some embodiments, computing platform 3000 comprises memory 3001, Processor 3002, machine-readable storage media 3003 (also referred to as tangible machine readable medium), communication interface 3004 (e.g., wireless or wired interface), graphical user interface (GUI) 3005, and network bus 3006 coupled together as shown.

In some embodiments, processor 3002 is a Digital Signal Processor (DSP), an Application Specific Integrated Circuit (ASIC), a general-purpose Central Processing Unit (CPU), or a low power logic implementing a simple finite state machine to perform the various embodiments, etc.

In some embodiments, GUI 3005 receives the command for generating intent driven trunk topology. The various input parameters and options can be selected via GUI 3005, and results can be displayed on a display showing the trunk topology.

In some embodiments, the various logic blocks of system 3000 are coupled together via Network Bus 3006. Any suitable protocol may be used to implement Network Bus 3006. In some embodiments, Machine-Readable Storage Medium 3003 includes Instructions (also referred to as the program software code/instructions) for generating intent driven trunk topology as described with reference to various embodiments and flowcharts.

Program software code/instructions associated with the flowcharts (and/or various embodiments and executed to implement embodiments of the disclosed subject matter may be implemented as part of an operating system or a specific application, component, program, object, module, routine, or other sequence of instructions or organization of sequences of instructions referred to as "program software code/instructions," "operating system program software code/instructions," "application program software code/instructions," or simply "software" or firmware embedded in processor. In some embodiments, the program software code/instructions associated with flowcharts and/or various embodiments are executed by system 3000.

In some embodiments, the program software code/instructions associated with the flowcharts (and/or various embodiments) are stored in a computer executable storage medium 3003 and executed by processor 3002. Here, computer executable storage medium 3003 is a tangible machine-readable medium that can be used to store program software code/instructions and data that, when executed by a computing device, causes one or more processors (e.g., processor 3002) to perform a method(s) as may be recited in one or more accompanying claims directed to the disclosed subject matter.

The tangible machine readable medium 3003 may include storage of the executable software program code/instructions and data in various tangible locations, including for example ROM, volatile RAM, non-volatile memory and/or cache and/or other tangible memory as referenced in the present application. Portions of this program software code/instructions and/or data may be stored in any one of these storage and memory devices. Further, the program software code/instructions can be obtained from other storage, including, e.g., through centralized servers or peer to peer networks and the like, including the Internet. Different portions of the software program code/instructions and data can be obtained at different times and in different communication sessions or in the same communication session.

The software program code/instructions (associated with the flowcharts and other embodiments) and data can be obtained in their entirety prior to the execution of a respective software program or application by the computing device. Alternatively, portions of the software program code/instructions and data can be obtained dynamically, e.g., just in time, when needed for execution. Alternatively, some combination of these ways of obtaining the software program code/instructions and data may occur, e.g., for different applications, components, programs, objects, modules, routines or other sequences of instructions or organization of sequences of instructions, by way of example. Thus, it is not required that the data and instructions be on a tangible machine readable medium in entirety at a particular instance of time.

Examples of tangible computer-readable media 3003 include but are not limited to recordable and non-recordable type media such as volatile and non-volatile memory devices, read only memory (ROM), random access memory (RAM), flash memory devices, floppy and other removable disks, magnetic storage media, optical storage media (e.g., Compact Disk Read-Only Memory (CD ROMS), Digital Versatile Disks (DVDs), etc.), among others. The software program code/instructions may be temporarily stored in digital tangible communication links while implementing electrical, optical, acoustical or other forms of propagating signals, such as carrier waves, infrared signals, digital signals, etc. through such tangible communication links.

In general, tangible machine readable medium 3003 includes any tangible mechanism that provides (i.e., stores and/or transmits in digital form, e.g., data packets) information in a form accessible by a machine (i.e., a computing device), which may be included, e.g., in a communication device, a computing device, a network device, a personal digital assistant, a manufacturing tool, a mobile communication device, whether or not able to download and run applications and subsidized applications from the communication network, such as the Internet, e.g., an iPhone®, Galaxy®, Blackberry® Droid®, or the like, or any other device including a computing device. In one embodiment, processor-based system is in a form of or included within a PDA (personal digital assistant), a cellular phone, a notebook computer, a tablet, a game console, a set top box, an embedded system, a TV (television), a personal desktop computer, etc. Alternatively, the traditional communication applications and subsidized application(s) may be used in some embodiments of the disclosed subject matter.

Figure 31:
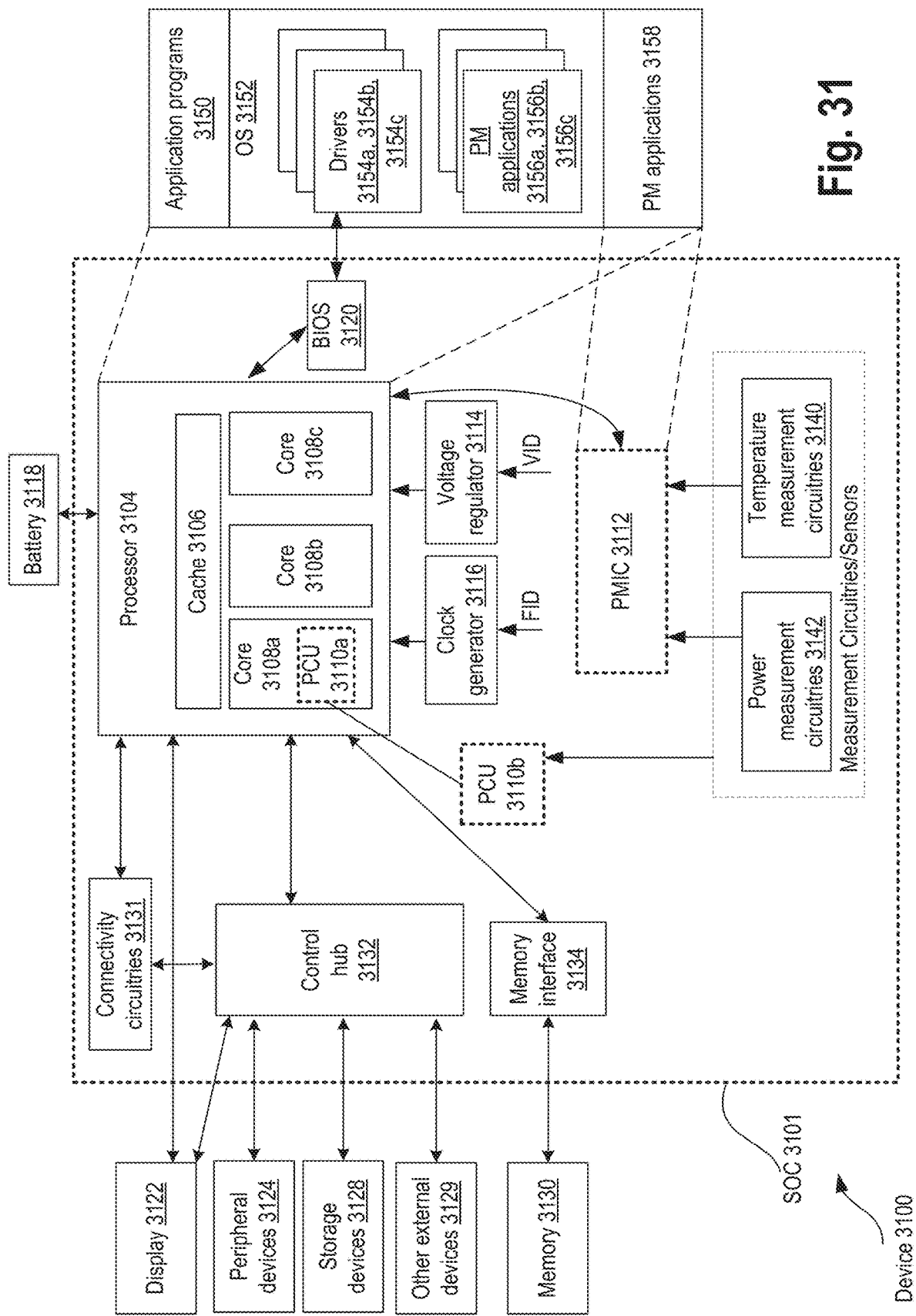
FIG. 31 illustrates a smart device or a computer system or a SoC (System-on-Chip) designed using the intent driven trunk topology, in accordance with some embodiments.

FIG. 31 illustrates a smart device or a computer system or a SoC (System-on-Chip) designed using the intent driven trunk topology, in accordance with some embodiments. In some embodiments, device 3100 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 3100.

In an example, the device 3100 comprises an SoC (System-on-Chip) 3101. An example boundary of the SoC 3101 is illustrated using dotted lines in FIG. 31, with some example components being illustrated to be included within SoC 3101—however, SoC 3101 may include any appropriate components of device 3100.

In some embodiments, device 3100 includes processor 3104. Processor 3104 can include one or more physical devices, such as microprocessors, application processors, microcontrollers, programmable logic devices, processing cores, or other processing means. The processing operations performed by processor 3104 include the execution of an operating platform or operating system on which applications and/or device functions are executed. The processing operations include operations related to I/O (input/output) with a human user or with other devices, operations related to power management, operations related to connecting computing device 3100 to another device, and/or the like. The processing operations may also include operations related to audio I/O and/or display I/O.

In some embodiments, processor 3104 includes multiple processing cores (also referred to as cores) 3108a, 3108b, 3108c. Although merely three cores 3108a, 3108b, 3108c are illustrated in FIG. 31, processor 3104 may include any other appropriate number of processing cores, e.g., tens, or even hundreds of processing cores. Processor cores 3108a, 3108b, 3108c may be implemented on a single integrated circuit (IC) chip. Moreover, the chip may include one or more shared and/or private caches, buses or interconnections, graphics and/or memory controllers, or other components.

In some embodiments, processor 3104 includes cache 3106. In an example, sections of cache 3106 may be dedicated to individual cores 3108 (e.g., a first section of cache 3106 dedicated to core 3108a, a second section of cache 3106 dedicated to core 3108b, and so on). In an example, one or more sections of cache 3106 may be shared among two or more of cores 3108. Cache 3106 may be split in different levels, e.g., level 1 (L1) cache, level 2 (L2) cache, level 3 (L3) cache, etc.

In some embodiments, processor core 3104 may include a fetch unit to fetch instructions (including instructions with conditional branches) for execution by the core 3104. The instructions may be fetched from any storage devices such as the memory 3130. Processor core 3104 may also include a decode unit to decode the fetched instruction. For example, the decode unit may decode the fetched instruction into a plurality of micro-operations. Processor core 3104 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 3104 may be an out-of-order processor core in one embodiment. Processor core 3104 may also include a retirement unit. The retirement unit may retire executed instructions after they are committed. In an embodiment, retirement of the executed instructions may result in processor state being committed from the execution of the instructions, physical registers used by the instructions being de-allocated, etc. Processor core 3104 may also include a bus unit to enable communication between components of processor core 3104 and other components via one or more buses. Processor core 3104 may also include one or more registers to store data accessed by various components of the core 3104 (such as values related to assigned app priorities and/or sub-system states (modes) association.

In some embodiments, device 3100 comprises connectivity circuitries 3131. For example, connectivity circuitries 3131 includes hardware devices (e.g., wireless and/or wired connectors and communication hardware) and/or software components (e.g., drivers, protocol stacks), e.g., to enable device 3100 to communicate with external devices. Device 3100 may be separate from the external devices, such as other computing devices, wireless access points or base stations, etc.

In an example, connectivity circuitries 3131 may include multiple different types of connectivity. To generalize, the connectivity circuitries 3131 may include cellular connectivity circuitries, wireless connectivity circuitries, etc. Cellular connectivity circuitries of connectivity circuitries 3131 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP)

Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 3131 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 3131 may include a network interface, such as a wired or wireless interface, e.g., so that a system embodiment may be incorporated into a wireless device, for example, a cell phone or personal digital assistant.

In some embodiments, device 3100 comprises control hub 3132, which represents hardware devices and/or software components related to interaction with one or more I/O devices. For example, processor 3104 may communicate with one or more of display 3122, one or more peripheral devices 3124, storage devices 3128, one or more other external devices 3129, etc., via control hub 3132. Control hub 3132 may be a chipset, a Platform Control Hub (PCH), and/or the like.

For example, control hub 3132 illustrates one or more connection points for additional devices that connect to device 3100, e.g., through which a user might interact with the system. For example, devices (e.g., devices 3129) that can be attached to device 3100 include microphone devices, speaker or stereo systems, audio devices, video systems or other display devices, keyboard or keypad devices, or other I/O devices for use with specific applications such as card readers or other devices.

As mentioned above, control hub 3132 can interact with audio devices, display 3122, etc. For example, input through a microphone or other audio device can provide input or commands for one or more applications or functions of device 3100. Additionally, audio output can be provided instead of, or in addition to display output. In another example, if display 3122 includes a touch screen, display 3122 also acts as an input device, which can be at least partially managed by control hub 3132. There can also be additional buttons or switches on computing device 3100 to provide I/O functions managed by control hub 3132. In one embodiment, control hub 3132 manages devices such as accelerometers, cameras, light sensors or other environmental sensors, or other hardware that can be included in device 3100. The input can be part of direct user interaction, as well as providing environmental input to the system to influence its operations (such as filtering for noise, adjusting displays for brightness detection, applying a flash for a camera, or other features).

In some embodiments, control hub 3132 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 3122 represents hardware (e.g., display devices) and software (e.g., drivers) components that provide a visual and/or tactile display for a user to interact with device 3100. Display 3122 may include a display interface, a display screen, and/or hardware device used to provide a display to a user. In some embodiments, display 3122 includes a touch screen (or touch pad) device that provides both output and input to a user. In an example, display 3122 may communicate directly with the processor 3104. Display 3122 can be one or more of an internal display device, as in a mobile electronic device or a laptop device or an external display device attached via a display interface (e.g., DisplayPort, etc.). In one embodiment display 3122 can be a head mounted display (HMD) such as a stereoscopic display device for use in virtual reality (VR) applications or augmented reality (AR) applications.

In some embodiments, and although not illustrated in the figure, in addition to (or instead of) processor 3104, device 3100 may include Graphics Processing Unit (GPU) comprising one or more graphics processing cores, which may control one or more aspects of displaying contents on display 3122.

Control hub 3132 (or platform controller hub) may include hardware interfaces and connectors, as well as software components (e.g., drivers, protocol stacks) to make peripheral connections, e.g., to peripheral devices 3124.

It will be understood that device 3100 could both be a peripheral device to other computing devices, as well as have peripheral devices connected to it. Device 3100 may have a "docking" connector to connect to other computing devices for purposes such as managing (e.g., downloading and/or uploading, changing, synchronizing) content on device 3100. Additionally, a docking connector can allow device 3100 to connect to certain peripherals that allow computing device 3100 to control content output, for example, to audiovisual or other systems.

In addition to a proprietary docking connector or other proprietary connection hardware, device 3100 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 3131 may be coupled to control hub 3132, e.g., in addition to, or instead of, being coupled directly to the processor 3104. In some embodiments, display 3122 may be coupled to control hub 3132, e.g., in addition to, or instead of, being coupled directly to processor 3104.

In some embodiments, device 3100 comprises memory 3130 coupled to processor 3104 via memory interface 3134. Memory 3130 includes memory devices for storing information in device 3100.

In some embodiments, memory 3130 includes apparatus to maintain stable clocking as described with reference to various embodiments. Memory can include nonvolatile (state does not change if power to the memory device is interrupted) and/or volatile (state is indeterminate if power to the memory device is interrupted) memory devices. Memory device 3130 can be a dynamic random-access memory (DRAM) device, a static random-access memory (SRAM) device, flash memory device, phase-change memory device, or some other memory device having suitable performance to serve as process memory. In one embodiment, memory 3130 can operate as system memory for device 3100, to store data and instructions for use when the one or more processors 3104 executes an application or process. Memory 3130 can store application data, user data, music, photos, documents, or other data, as well as system data (whether long-term or temporary) related to the execution of the applications and functions of device 3100.

Elements of various embodiments and examples are also provided as a machine-readable medium (e.g., memory 3130) for storing the computer-executable instructions (e.g., instructions to implement any other processes discussed herein). The machine-readable medium (e.g., memory 3130) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 3100 comprises temperature measurement circuitries 3140, e.g., for measuring temperature of various components of device 3100. In an example, temperature measurement circuitries 3140 may be embedded, or coupled or attached to various components, whose temperature are to be measured and monitored. For example, temperature measurement circuitries 3140 may measure temperature of (or within) one or more of cores 3108a, 3108b, 3108c, voltage regulator 3114, memory 3130, a mother-board of SoC 3101, and/or any appropriate component of device 3100.

In some embodiments, device 3100 comprises power measurement circuitries 3142, e.g., for measuring power consumed by one or more components of the device 3100. In an example, in addition to, or instead of, measuring power, the power measurement circuitries 3142 may measure voltage and/or current. In an example, the power measurement circuitries 3142 may be embedded, or coupled or attached to various components, whose power, voltage, and/or current consumption are to be measured and monitored. For example, power measurement circuitries 3142 may measure power, current and/or voltage supplied by one or more voltage regulators 3114, power supplied to SoC 3101, power supplied to device 3100, power consumed by processor 3104 (or any other component) of device 3100, etc.

In some embodiments, device 3100 comprises one or more voltage regulator circuitries, generally referred to as voltage regulator (VR) 3114. VR 3114 generates signals at appropriate voltage levels, which may be supplied to operate any appropriate components of the device 3100. Merely as an example, VR 3114 is illustrated to be supplying signals to processor 3104 of device 3100. In some embodiments, VR 3114 receives one or more Voltage Identification (VID) signals, and generates the voltage signal at an appropriate level, based on the VID signals. Various type of VRs may be utilized for the VR 3114. For example, VR 3114 may include a "buck" VR, "boost" VR, a combination of buck and boost VRs, low dropout (LDO) regulators, switching DC-DC regulators, constant-on-time controller-based DC-DC regulator, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR, which is controlled by PCU 3110a/b and/or PMIC 3112. In some embodiments, each core has a network of distributed LDOs to provide efficient control for power management. The LDOs can be digital, analog, or a combination of digital or analog LDOs. In some embodiments, VR 3114 includes current tracking apparatus to measure current through power supply rail(s).

In some embodiments, device 3100 comprises one or more clock generator circuitries, generally referred to as clock generator 3116. Clock generator 3116 generates clock signals at appropriate frequency levels, which may be supplied to any appropriate components of device 3100. Merely as an example, clock generator 3116 is illustrated to be supplying clock signals to processor 3104 of device 3100. In some embodiments, clock generator 3116 receives one or more Frequency Identification (FID) signals, and generates the clock signals at an appropriate frequency, based on the FID signals.

In some embodiments, device 3100 comprises battery 3118 supplying power to various components of device 3100. Merely as an example, battery 3118 is illustrated to be supplying power to processor 3104. Although not illustrated in the figures, device 3100 may comprise a charging circuitry, e.g., to recharge the battery, based on Alternating Current (AC) power supply received from an AC adapter.

In some embodiments, device 3100 comprises Power Control Unit (PCU) 3110 (also referred to as Power Management Unit (PMU), Power Controller, etc.). In an example, some sections of PCU 3110 may be implemented by one or more processing cores 3108, and these sections of PCU 3110 are symbolically illustrated using a dotted box and labelled PCU 3110a. In an example, some other sections of PCU 3110 may be implemented outside the processing cores 3108, and these sections of PCU 3110 are symbolically illustrated using a dotted box and labelled as PCU 3110b. PCU 3110 may implement various power management operations for device 3100. PCU 3110 may include hardware interfaces, hardware circuitries, connectors, registers, etc., as well as software components (e.g., drivers, protocol stacks), to implement various power management operations for device 3100.

In some embodiments, device 3100 comprises Power Management Integrated Circuit (PMIC) 3112, e.g., to implement various power management operations for device 3100. In some embodiments, PMIC 3112 is a Reconfigurable Power Management ICs (RPMICs) and/or an IMVP (Intel® Mobile Voltage Positioning). In an example, the PMIC is within an IC chip separate from processor 3104. The may implement various power management operations for device 3100. PMIC 3112 may include hardware interfaces, hardware circuitries, connectors, registers, etc., as well as software components (e.g., drivers, protocol stacks), to implement various power management operations for device 3100.

In an example, device 3100 comprises one or both PCU 3110 or PMIC 3112. In an example, any one of PCU 3110 or PMIC 3112 may be absent in device 3100, and hence, these components are illustrated using dotted lines.

Various power management operations of device 3100 may be performed by PCU 3110, by PMIC 3112, or by a combination of PCU 3110 and PMIC 3112. For example, PCU 3110 and/or PMIC 3112 may select a power state (e.g., P-state) for various components of device 3100. For example, PCU 3110 and/or PMIC 3112 may select a power state (e.g., in accordance with the ACPI (Advanced Configuration and Power Interface) specification) for various components of device 3100. Merely as an example, PCU 3110 and/or PMIC 3112 may cause various components of the device 3100 to transition to a sleep state, to an active state, to an appropriate C state (e.g., C0 state, or another appropriate C state, in accordance with the ACPI specification), etc. In an example, PCU 3110 and/or PMIC 3112 may control a voltage output by VR 3114 and/or a frequency of a clock signal output by the clock generator, e.g., by outputting the VID signal and/or the FID signal, respectively. In an example, PCU 3110 and/or PMIC 3112 may control battery power usage, charging of battery 3118, and features related to power saving operation.

The clock generator 3116 can comprise a phase locked loop (PLL), frequency locked loop (FLL), or any suitable clock source. In some embodiments, each core of processor 3104 has its own clock source. As such, each core can operate at a frequency independent of the frequency of operation of the other core. In some embodiments, PCU 3110 and/or PMIC 3112 performs adaptive or dynamic frequency scaling or adjustment. For example, clock frequency of a processor core can be increased if the core is not operating at its maximum power consumption threshold or limit. In some embodiments, PCU 3110 and/or PMIC 3112 determines the operating condition of each core of a processor, and opportunistically adjusts frequency and/or power supply voltage of that core without the core clocking source (e.g., PLL of that core) losing lock when the PCU 3110 and/or PMIC 3112 determines that the core is operating below a target performance level. For example, if a core is drawing current from a power supply rail less than a total current allocated for that core or processor 3104, then PCU 3110 and/or PMIC 3112 can temporality increase the power draw for that core or processor 3104 (e.g., by increasing clock frequency and/or power supply voltage level) so that the core or processor 3104 can perform at higher performance level. As such, voltage and/or frequency can be increased temporality for processor 3104 without violating product reliability.

In an example, PCU 3110 and/or PMIC 3112 may perform power management operations, e.g., based at least in part on receiving measurements from power measurement circuitries 3142, temperature measurement circuitries 3140, charge level of battery 3118, and/or any other appropriate information that may be used for power management. To that end, PMIC 3112 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 3110 and/or PMIC 3112 in at least one embodiment to allow PCU 3110 and/or PMIC 3112 to manage processor core energy at least in part based on value(s) detected by one or more of the sensors.

Also illustrated is an example software stack of device 3100 (although not all elements of the software stack are illustrated). Merely as an example, processors 3104 may execute application programs 3150, Operating System 3152, one or more Power Management (PM) specific application programs (e.g., generically referred to as PM applications 3158), and/or the like. PM applications 3158 may also be executed by the PCU 3110 and/or PMIC 3112. OS 3152 may also include one or more PM applications 3156a, 3156b, 3156c. The OS 3152 may also include various drivers 3154a, 3154b, 3154c, etc., some of which may be specific for power management purposes. In some embodiments, device 3100 may further comprise a Basic Input/output System (BIOS) 3120. BIOS 3120 may communicate with OS 3152 (e.g., via one or more drivers 3154), communicate with processors 3104, etc.

For example, one or more of PM applications 3158, 3156, drivers 3154, BIOS 3120, etc. may be used to implement power management specific tasks, e.g., to control voltage and/or frequency of various components of device 3100, to control wake-up state, sleep state, and/or any other appropriate power state of various components of device 3100, control battery power usage, charging of the battery 3118, features related to power saving operation, etc.

In some embodiments, battery 3118 is a Li-metal battery with a pressure chamber to allow uniform pressure on a battery. The pressure chamber is supported by metal plates (such as pressure equalization plate) used to give uniform pressure to the battery. The pressure chamber may include pressured gas, elastic material, spring plate, etc. The outer skin of the pressure chamber is free to bow, restrained at its edges by (metal) skin, but still exerts a uniform pressure on the plate that is compressing the battery cell. The pressure chamber gives uniform pressure to battery, which is used to enable high-energy density battery with, for example, 20% more battery life.

In some embodiments, pCode executing on PCU 3110a/b has a capability to enable extra compute and telemetries resources for the runtime support of the pCode. Here pCode refers to a firmware executed by PCU 3110a/b to manage performance of the SoC 3101. For example, pCode may set frequencies and appropriate voltages for the processor. Part of the pCode are accessible via OS 3152. In various embodiments, mechanisms and methods are provided that dynamically change an Energy Performance Preference (EPP) value based on workloads, user behavior, and/or system conditions. There may be a well-defined interface between OS 3152 and the pCode. The interface may allow or facilitate the software configuration of several parameters and/or may provide hints to the pCode. As an example, an EPP parameter may inform a pCode algorithm as to whether performance or battery life is more important.

This support may be done as well by the OS 3152 by including machine-learning support as part of OS 3152 and either tuning the EPP value that the OS hints to the hardware (e.g., various components of SoC 3101) by machine-learning prediction, or by delivering the machine-learning prediction to the pCode in a manner similar to that done by a Dynamic Tuning Technology (DTT) driver. In this model, OS 3152 may have visibility to the same set of telemetries as are available to a DTT. As a result of a DTT machine-learning hint setting, pCode may tune its internal algorithms to achieve optimal power and performance results following the machine-learning prediction of activation type. The pCode as example may increase the responsibility for the processor utilization change to enable fast response for user activity, or may increase the bias for energy saving either by reducing the responsibility for the processor utilization or by saving more power and increasing the performance lost by tuning the energy saving optimization. This approach may facilitate saving more battery life in case the types of activities enabled lose some performance level over what the system can enable. The pCode may include an algorithm for dynamic EPP that may take the two inputs, one from OS 3152 and the other from software such as DTT, and may selectively choose to provide higher performance and/or responsiveness. As part of this method, the pCode may enable in the DTT an option to tune its reaction for the DTT for different types of activity.

In some embodiments, use a processor core energy-efficiency core ranking scheme. This is akin to a favored core in a multi-core processor system. However, the favored core (e.g., one of 3108) here is the energy-efficient core that allows the SoC to use the core with the lowest $V_{min}$ for energy-efficiency (e.g., low power consumption). Such $V_{min}$ values may be fused in appropriate registers during the High-Volume Manufacturing (HVM) process. In some embodiments, an operating system (OS) scheduler can achieve optimal energy performance using the core ranking information to schedule certain applications on the core with lowest $V_{min}$.

In some embodiments, the bootstrap flow identifies the bootstrap processor core (BSP) as the most energy efficiency core of the SoC and assigns the that core the lowest APIC (Advanced processor interrupt controller) ID (identification) value. The APIC ID value that specifies a target processor to receive interrupt delivered in logical destination mode in a local x2APIC. This is a 32-bit value initialized by hardware. While the APIC ID is an Intel Architecture term, a similar function in other processor architectures can also be used to identify a bootstrap processor. Initially, BSP is core0 3108*a* or any core of a multi-core system. In a heterogenous set of cores comprising big cores (or complex and/or high-power applications) and little cores (for less complex and/or low power applications), the BSP can be one of the little cores. This initial BSP is used to identify the FE BSP.

In that context, the microcode (e.g., pCode) or BIOS 3120 (built-in input output system) reads the fuses that store the per-core $V_{min}$ values. These fuses are programmed during HVM. Upon reading the fuses, the microcode or BIOS 3120 calculates and ranks the cores. As such, microcode (e.g., pCode) or BIOS 3120 calculates and ranks core APIC IDs based on efficiency around LFM (low frequency mode) frequencies. Based on the calculated and ranked cores, the microcode or BIOS 3120 transfers BSP ownership to the most efficiency core (e.g., with higher ranking number) by setting a register (e.g., IA32_APIC_BASE.BSP=1).

In some embodiments, the microcode or BIOS 3120 then shares the APIC IDs of the cores ranked based on efficiency to the operation system (or kernel). For example, the microcode or BIOS shares the APIC IDs of the cores ranked based on efficiency to the OS via ACPI (Advanced configuration and power interface) tables such as the MADT (multiple interrupt controller table).

With the reordered APIC IDs, the OS services low utilization tasks, interrupts, DPCs, efficiently on the core with the lowest $V_{min}$. Note, APIC ID re-ordering also allows for more efficiency HW interrupt routing. In some embodiments, the OS scheduler uses the efficient cores as preferred or favored cores for thread scheduling. If the SoC supports dynamic hardware (HW) feedback, then the pCode (or any suitable microcode or firmware) shares the updated efficiency core ranking via shared memory or MSR (model-specific register) interface.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process. The examples can be combined in any combinations. For example, example 4 can be combined with example 2.

Example 1

A machine-readable storage media having machine-readable instructions that when executed cause one or more processors to perform a method comprising: receiving a command with input parameters and options, wherein the command specifies nets, one or more zones, and topology description that expresses a trunking design intent; executing the command; and generating one or more trunks on the nets according to the topology description in response to executing the command.

Example 2

The machine-readable storage media of example 1 having machine-readable instructions that when executed cause the one or more processors to perform the method comprising: verifying the received command for validity prior to executing the command; and notifying a user of any error in the received command and prompting the user to reenter the command.

Example 3

The machine-readable storage media of example 1, wherein generating the one or more trunks comprises: fetching tracks from a current design; and numbering the tracks relative to an origin of the one or more zones in view of obstructions, porosity, and/or avoid areas in the one or more zones, wherein the zone comprises a plurality of edges, and wherein the edges are numbered clockwise from an orientation of the one or more zones.

Example 4

The machine-readable storage media of example 1, wherein the command is process technology node independent.

Example 5

The machine-readable storage media of example 1, wherein the one or more zones is one of: a current block, wherein a geometry of the current block defines the zone; a bounding box described by coordinates relative to the current block, wherein the bounding box defines the zone; a cell at any design hierarchy wherein the geometry of the cell defines a boundary of the zone; net or bus at any level of hierarchy, wherein a bounding box of the net defines the zone; blockage, placement or routing, wherein a geometry of the blockage, placement or routing defines the zone; and gutter or a range of gutters, wherein a bounding box of gutters from a start gutter to an end gutter defines the zone.

Example 6

The machine-readable storage media of example 1, wherein the command comprises a starting point and an ending point, wherein the starting point includes fields separated by a separator.

Example 7

The machine-readable storage media of example 6, wherein the separator comprises a comma.

Example 8

The machine-readable storage media of example 6, wherein the fields include: zone, layer, width of a track of the layer, and coordinate reference.

Example 9

The machine-readable storage media of example 6, wherein the end point comprises one or more fields.

Example 10

The machine-readable storage media of example 8, wherein the coordinate reference is applied to calculate a micron value of a coordinate based on a current design state.

Example 11

The machine-readable storage media of example 1, wherein generating the one or more trunks comprises applying a topology model including a start point, and end point, and any number of intermediate jog points connected by segments of one or more layers and widths, wherein the one or more layers correspond to one or more layers of a process technology node.

Example 12

The machine-readable storage media of example 1, wherein the one or more zones is a reference system of coordinates of a virtual object to calculate a topology point coordinate.

Example 13

The machine-readable storage media of example 1, wherein if the command includes a preview mode, the one or more trunks are not saved in a database, and wherein if the command does not include a preview mode, the one or more trunks are saved in the database.

Example 14

The machine-readable storage media of example 1, wherein the command includes: a stepping option to create a stair case of tracks used to form the one or more trunks; an option to create a pair of swizzle or twisted tracks used to form the one or more trunks; and/or an option to shield a signal net with power supply and/or ground routes in a same metal layer.

Example 15

An apparatus comprising: a memory to store computer-executable instructions; a processor coupled to the memory, wherein the processor is to execute the computer-executable instructions to perform an operation comprising: receive a command with input parameters and options, wherein the command specifies nets, one or more zones, and topology description that expresses a trunking design intent; execute the command; and generate one or more trunks according to the topology description in response to executing the command; and a display to display the one or more trunks.

Example 16

The apparatus of example 15, wherein the command comprises a starting point and an ending point, wherein the starting point includes a first set of fields separated by a separator, wherein the separator comprises a comma, wherein the fields include: a zone, layer, width a track on the layer, and coordinate reference, and wherein the end point comprises a second set of fields.

Example 17

The apparatus of example 15, wherein the processor is to apply a topology model including a start point, and end point, and any number of intermediate jog points connected by segments of one or more layers and widths, to generate the one or more trunks, wherein the one or more layers correspond to one or more layers of a process technology node.

Example 18

The apparatus of example 15, wherein the zone is a reference system coordinate of a virtual object to calculate a topology point coordinate.

Example 19

The apparatus of example 18, wherein the virtual object is one of: an exact track number; location in micron; location in micron snapped to a closest track number; last track number in the zone; third from the last track number in the zone; a percentage of track capacity; reference from a port; reference from a pin; track number associated with an edge; track number in a gutter; or a track on a specified layer.

Example 20

The apparatus of example 15, wherein if the command includes a preview mode, the one or more trunks are not saved in a database, and wherein if the command does not include a preview mode, the one or more trunks are saved in the database.

Example 21

A machine-readable storage media having machine-readable instructions that when executed cause one or more processors to perform a method comprising: opening a graphical user interface; setting a command with input parameters and options in the graphical user interface, wherein the command specifies, nets, one or more zones and topology description that expresses a trunking design intent; executing the command via a push button on the graphical user interface; and generating one or more trunks according to the topology description in response to executing the command.

Example 22

The machine-readable storage media of example 21 having machine-readable instructions that when executed cause the one or more processors to perform the method comprising: verifying the command for validity prior to executing the command; and notifying a user on the graphical user interface of any error in the received command and prompting the user to reenter the command.

Example 23

The machine-readable storage media of example 21, wherein generating the one or more trunks comprises: fetching tracks from a current design; and numbering the tracks relative to an edge of the zone in view of obstructions, porosity, and/or avoid areas in the zone, wherein the zone comprises a plurality of edges, and wherein the edges are numbered clockwise from an orientation of the zone.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. A non-transitory machine-readable storage media having machine-readable instructions that when executed cause one or more processors to perform a method comprising:
   receiving a command with input parameters and options, wherein the command specifies nets, one or more zones, and topology description that expresses a trunking design intent;
   executing the command; and
   generating one or more trunks on the nets according to the topology description in response to executing the command.

2. The non-transitory machine-readable storage media of claim 1 having machine-readable instructions that when executed cause the one or more processors to perform the method comprising:
   verifying the received command for validity prior to executing the command; and
   notifying a user of any error in the received command and prompting the user to reenter the command.

3. The non-transitory machine-readable storage media of claim 1,
   wherein generating the one or more trunks comprises:
   fetching tracks from a current design; and
   numbering the tracks relative to an origin of the one or more zones in view of obstructions, porosity, and/or avoid areas in the one or more zones, wherein the zone comprises a plurality of edges, and wherein the edges are numbered clockwise from an orientation of the one or more zones.

4. The non-transitory machine-readable storage media of claim 1,
   wherein the command is process technology node independent.

5. The non-transitory machine-readable storage media of claim 1,
   wherein the one or more zones is one of:
   a current block, wherein a geometry of the current block defines the zone;
   a bounding box described by coordinates relative to the current block, wherein the bounding box defines the zone;
   a cell at any design hierarchy wherein the geometry of the cell defines a boundary of the zone;
   a net or bus at any level of hierarchy, wherein a bounding box of the net defines the zone;
   a blockage, placement, or routing, wherein a geometry of the blockage, placement, or routing defines the zone; and
   a gutter or a range of gutters, wherein a bounding box of gutters from a start gutter to an end gutter defines the zone.

6. The non-transitory machine-readable storage media of claim 1, wherein the command comprises a starting point and an ending point, wherein the starting point includes fields separated by a separator.

7. The non-transitory machine-readable storage media of claim 6, wherein the separator comprises a comma.

8. The non-transitory machine-readable storage media of claim 6, wherein the fields include: zone, layer, width of a track of the layer, and coordinate reference.

9. The non-transitory machine-readable storage media of claim 8, wherein the coordinate reference is applied to calculate a micron value of a coordinate based on a current design state.

10. The non-transitory machine-readable storage media of claim 6, wherein the end point comprises one or more fields.

11. The non-transitory machine-readable storage media of claim 1, wherein generating the one or more trunks comprises applying a topology model including a start point, an end point, and any number of intermediate jog points connected by segments of one or more layers and widths, wherein the one or more layers correspond to one or more layers of a process technology node.

12. The non-transitory machine-readable storage media of claim 1, wherein the one or more zones is a reference system of coordinates of a virtual object to calculate a topology point coordinate.

13. The non-transitory machine-readable storage media of claim 1, wherein, if the command includes a preview mode, the one or more trunks are not saved in a database; and if the command does not include a preview mode, the one or more trunks are saved in the database.

14. The non-transitory machine-readable storage media of claim 1, wherein the command includes:
   a stepping option to create a staircase of tracks used to form the one or more trunks;
   an option to create a pair of swizzle or twisted tracks used to form the one or more trunks; and/or
   an option to shield a signal net with power supply and/or ground routes in a same metal layer.

15. An apparatus comprising:
   a memory to store computer-executable instructions;
   a processor coupled to the memory, wherein the processor is to execute the computer-executable instructions to perform an operation comprising:
      receive a command with input parameters and options, wherein the command specifies nets, one or more zones, and topology description that expresses a trunking design intent;
      execute the command; and
      generate one or more trunks according to the topology description in response to executing the command; and
   a display to display the one or more trunks.

16. The apparatus of claim 15, wherein the command comprises a starting point and an ending point, wherein the starting point includes a first set of fields separated by a separator, wherein the separator comprises a comma, wherein the fields include: a zone, layer, width of a track on the layer, and coordinate reference, and wherein the end point comprises a second set of fields.

17. The apparatus of claim 15, wherein the processor is to apply a topology model including a start point, an end point, and any number of intermediate jog points connected by segments of one or more layers and widths, to generate the one or more trunks, wherein the one or more layers correspond to one or more layers of a process technology node.

18. The apparatus of claim 15, wherein the zone is a reference system coordinate of a virtual object to calculate a topology point coordinate.

19. The apparatus of claim 18, wherein the virtual object is one of:
   an exact track number;
   location in micron;
   location in micron snapped to a closest track number;
   last track number in the zone;
   third from the last track number in the zone;
   a percentage of track capacity;
   reference from a port;
   reference from a pin;
   track number associated with an edge;
   track number in a gutter; or
   a track on a specified layer.

20. The apparatus of claim 15, wherein if the command includes a preview mode, the one or more trunks are not saved in a database, and wherein if the command does not include a preview mode, the one or more trunks are saved in the database.

21. A non-transitory machine-readable storage media having machine-readable instructions that when executed cause one or more processors to perform a method comprising:
   opening a graphical user interface;
   setting a command with input parameters and options in the graphical user interface, wherein the command specifies nets, one or more zones, and topology description that expresses a trunking design intent;
   executing the command via a push button on the graphical user interface; and
   generating one or more trunks according to the topology description in response to executing the command.

22. The non-transitory machine-readable storage media of claim 21 having machine-readable instructions that when executed cause the one or more processors to perform the method comprising:
   verifying the command for validity prior to executing the command; and
   notifying a user on the graphical user interface of any error in the received command, and prompting the user to reenter the command.

23. The non-transitory machine-readable storage media of claim 21, wherein generating the one or more trunks comprises:
   fetching tracks from a current design; and
   numbering the tracks relative to an edge of the zone in view of obstructions, porosity, and/or avoid areas in the zone, wherein the zone comprises a plurality of edges, and wherein the edges are numbered clockwise from an orientation of the zone.

* * * * *

UNITED STATES PATENT AND TRADEMARK OFFICE
CERTIFICATE OF CORRECTION

PATENT NO. : 11,966,681 B2
APPLICATION NO. : 17/002611
DATED : April 23, 2024
INVENTOR(S) : Sergei Babokhov and Charles Magnuson It is certified that error appears in the above-identified patent and that said Letters Patent is hereby corrected as shown below:

In the Claims

Column 36
Claim 22, Line 37 "in the received command" should read -- in the command --

Signed and Sealed this
Eighth Day of October, 2024

*Katherine Kelly Vidal*

Katherine Kelly Vidal
*Director of the United States Patent and Trademark Office*